United States Patent
Yamagishi et al.

(10) Patent No.: US 8,030,419 B2
(45) Date of Patent: Oct. 4, 2011

(54) PROCESS FOR PRODUCING POLYMER FOR SEMICONDUCTOR LITHOGRAPHY

(75) Inventors: Takanori Yamagishi, Ichihara (JP); Ichiro Kato, Ichihara (JP); Satoshi Yamaguchi, Chuo-ku (JP); Kouzo Osaki, Funabashi (JP); Yasuo Shibata, Ichihara (JP); Isao Magara, Ichihara (JP); Hideki Omori, Chuo-ku (JP); Kensuke Iuchi, Ichihara (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 312 days.

(21) Appl. No.: 12/519,371

(22) PCT Filed: Dec. 20, 2007

(86) PCT No.: PCT/JP2007/001447
§ 371 (c)(1), (2), (4) Date: Jun. 16, 2009

(87) PCT Pub. No.: WO2008/078410
PCT Pub. Date: Jul. 3, 2008

(65) Prior Publication Data
US 2010/0048848 A1    Feb. 25, 2010

(30) Foreign Application Priority Data
Dec. 22, 2006 (JP) .................. 2006-346454

(51) Int. Cl.
*C08F 2/06* (2006.01)
(52) U.S. Cl. .......................... 526/61; 526/72
(58) Field of Classification Search .............. 526/61, 526/72
See application file for complete search history.

(56) References Cited

U.S. PATENT DOCUMENTS

| | | | |
|---|---|---|---|
| 4,603,101 | A | 7/1986 | Crivello |
| 5,550,279 | A | 8/1996 | Yano et al. |
| 6,489,432 | B2 | 12/2002 | Jung et al. |
| 2001/0043992 | A1 | 11/2001 | Jung et al. |
| 2004/0167298 | A1 | 8/2004 | Yamagishi et al. |
| 2005/0287474 | A1 | 12/2005 | Yamagishi et al. |

FOREIGN PATENT DOCUMENTS

| | | |
|---|---|---|
| EP | 0 102 450 B1 | 3/1984 |
| JP | 59-45439 | 3/1984 |
| JP | 60 164200 | 10/1985 |
| JP | 62-115440 | 5/1987 |
| JP | 5-113667 | 5/1993 |
| JP | 06 192182 | 7/1994 |
| JP | 9-73173 | 3/1997 |
| JP | 9-90637 | 4/1997 |
| JP | 10-26828 | 1/1998 |
| JP | 10-161313 | 6/1998 |
| JP | 10-207069 | 8/1998 |
| JP | 2000-26446 | 1/2000 |

(Continued)

*Primary Examiner* — David W Wu
*Assistant Examiner* — Vu A Nguyen
(74) *Attorney, Agent, or Firm* — Oblon, Spivak, McClelland, Maier & Neustadt, L.L.P.

(57) ABSTRACT

To provide a method for producing a polymer for semiconductor lithography which can attain high uniformity in the polymer from lot to lot. The method for producing a polymer for semiconductor lithography includes the step (P) of heating a polymerizable monomer and a polymerization initiator in a solvent, to thereby polymerize the monomer, the step (P) having the step of controlling a polymerization pressure by regulating a liquid level in a container (WO) which is disposed between a polymerization tank and the atmospheric air and which provides liquid sealing.

11 Claims, 4 Drawing Sheets

FOREIGN PATENT DOCUMENTS

| | | |
|---|---|---|
| JP | 2000-313779 | 11/2000 |
| JP | 2001-27810 | 1/2001 |
| JP | 2001-192411 | 7/2001 |
| JP | 2001-226324 | 8/2001 |
| JP | 2001-242627 | 9/2001 |
| JP | 2003-57828 | 2/2003 |
| JP | 2004 269855 | 9/2004 |
| JP | 2006 176573 | 7/2006 |
| JP | 2006-193687 | 7/2006 |
| JP | 2006-243308 | 9/2006 |

PROCESS FOR PRODUCING POLYMER FOR SEMICONDUCTOR LITHOGRAPHY

TECHNICAL FIELD

The present invention relates to a method for producing a polymer for lithography for use in production of semiconductor devices. More particularly, the invention relates to a method for producing a polymer for use in production of a resist film as well as thin films such as an anti-reflection film, a gap-filling film, a top coating film, etc. which are formed on or under a resist film, these films being employed in a lithography step in production of semiconductor devices.

BACKGROUND ART

Production of semiconductor devices requires formation of finer lithography patterns for increasing the degree of integration. A key technique for forming such micropatterns is use of a radiation (light) source of short wavelength (as used herein, "light" refers to a type of radiation). In addition to g-line and i-line, which have hitherto been used, deep-UV radiations such as krypton fluoride (KrF) excimer laser radiation (wavelength: 248 nm) and argon fluoride (ArF) excimer laser radiation (wavelength: 193 nm) have been introduced for mass production of semiconductor devices. Meanwhile, studies have been conducted on lithography techniques employing, as a radiation source, fluorine dimer ($F_2$) excimer laser radiation (157 nm), extreme ultraviolet radiation (EUV), an electron beam (EB), or the like.

In the lithographic techniques, a resist film is employed for transferring a pattern to a substrate, and a variety of thin films may be optionally attached on or under the resist film. These thin films are formed through preparing a composition containing a polymer having a function of interest and an additive dissolved in an organic solvent, applying the composition to a substrate through spin-coating or a similar technique, and removing the solvent by optional heating or by curing the composition.

Resist films are divided into two types: a positive type resist; i.e., an irradiated portion is dissolved in a developer, and a negative type resist; i.e., a non-irradiated portion is dissolved in a developer. There have also been known, for example, a resist containing a compound whose solubility in a developer is varied by the effect of radiation, and a polymer as a binder which is soluble in an alkaline developer; a resist containing a compound which generates an acid by the effect of radiation (hereinafter may be referred to as "radiation-sensitive acid-generator"), and a polymer as a binder whose solubility in an alkaline developer is varied by the action of an acid. Particularly, the latter resist is called a chemical amplification-type resist, inter alia, a chemical amplification-type positive resist is particularly preferably employed in fine pattern processing.

As thin films formed on or under the resist film, there have been known, for example, an anti-reflection film, a gap-filling film, and a top coating film. The anti-reflection film is provided on a surface of a high-reflective substrate (forming a layer under the resist film) or a surface of the resist film (forming a layer on the resist film), to thereby suppress light reflection at the interface between the resist film and the reflective substrate and a standing wave, whereby fine resist patterns are accurately formed. The gap-filling film is provided on a surface of a substrate (forming a layer under the resist film or an anti-reflection film) in resist pattern formation on the pattern-formed substrate, whereby gaps present in the substrate surface are filled therewith, to thereby planarize the surface. The top coating film is provided on the resist film in immersion photolithography, in order to prevent migration of immersion liquid to the resist film and release of components such as a radiation-sensitive acid-generator from the resist film.

In the aforementioned composition in solution form for forming thin film, the polymer for lithography is an important component which is required to have optical, chemical, and physical properties so as to exhibit a function of interest to the thin film. Thus, extensive studies on the polymer for lithography are currently being carried out.

For example, as has been known, a chemical amplification-type positive resist with a KrF excimer laser employs, for example, a copolymer having a repeating unit derived from hydroxystyrene; and a repeating unit in which a phenolic hydroxyl group derived from hydroxystyrene is protected by an acid-dissociable dissolution-inhibitive group (e.g., an acetal structure or a tertiary hydrocarbon group), or a repeating unit in which a carboxyl group derived from (α-alkyl) acrylate is protected by an acid-dissociable dissolution-inhibitive group (e.g., an acetal structure or a tertiary hydrocarbon group) (see, for example, Patent Documents 1 to 4). There has also been known a copolymer having a repeating unit in which an alicyclic hydrocarbon group serves as an acid-dissociable dissolution-inhibitive group for increasing the dry etching resistance of the copolymer or for increasing the difference in rate of dissolution of the copolymer in an alkaline developer between before and after light exposure (see, for example, Patent Documents 5 and 6).

As candidates for a chemical amplification-type positive photoresist with ArF excimer laser radiation, there have been studied copolymers having no repeating unit which is derived from hydroxystyrene having a large absorption coefficient with respect to a wavelength of 193 nm. Actually, there have been known such copolymers formed of repeating units having a lactone structure, which is a polar group for enhancing adhesion to a semiconductor substrate or the like and regulating solubility of the copolymers in a solvent for lithography or in an alkaline developer (see, for example, Patent Documents 7 to 10).

As polymers for forming anti-reflection film, there have been known polymers formed of repeating units having an aromatic ring (e.g., benzene ring, naphthalene ring, or anthracene ring) serving as a functional group for enhancing absorption coefficients to wavelengths of 248 nm and 193 nm and refractive indexes of the polymers, and optional repeating units having a reactive functional group (e.g., amino, amide, hydroxyl, or epoxy), which reacts with a curing agent or the like to cause curing, for preventing intermixing with resist film (see, for example, Patent Documents 11 to 14).

As polymers for forming gap-filling film, there have been known polymers formed of repeating units having a reactive functional group, which has an appropriate viscosity suitable for pouring into narrow gaps and which reacts with a curing agent or the like to cause curing, for preventing intermixing with resist film or anti-reflection film. One specific example is a polymer formed of repeating units derived from hydroxystyrene and optional repeating units derived from a polymerizable monomer (e.g., styrene, alkyl (meth)acrylate, or hydroxyalkyl (meth)acrylate) (see, for example, Patent Document 15).

As copolymers for forming top coating film for immersion lithography, there have been known, for example, copolymers formed of repeating units having a carboxyl group (see, for example, Patent Document 16) and copolymers formed of repeating units having a hydroxyl group-substituted fluorine-containing group (see, for example, Patent Document 17).

In a trend for producing finer device patterns, there is keen demand for attaining uniformity in performance of a polymer from production lot to production lot (hereinafter "production lot" may be referred to as simply "lot"). In particular, when the weight average molecular weight (hereinafter may be referred to as "Mw") of the polymer varies, variations arise in the thickness of the polymer film formed through lithography, exposure energy for producing the polymer film, and lithographic characteristics such as dissolution rate in alkaline developer, raising problems such as failure to form consistent lithographic patterns. Therefore, there is demand for a method for producing a polymer, which method can considerably reduce the difference in Mw between production lots of the polymer.

Patent Document 1: JP-A-1984-045439
Patent Document 2: JP-A-1993-113667
Patent Document 3: JP-A-1998-026828
Patent Document 4: JP-A-1987-115440
Patent Document 5: JP-A-1997-073173
Patent Document 6: JP-A-1998-161313
Patent Document 7: JP-A-1997-090637
Patent Document 8: JP-A-1998-207069
Patent Document 9: JP-A-2000-026446
Patent Document 10: JP-A-2001-242627
Patent Document 11: JP-A-2000-313779
Patent Document 12: JP-A-2001-27810
Patent Document 13: JP-A-2001-192411
Patent Document 14: JP-A-2001-226324
Patent Document 15: JP-A-2003-57828
Patent Document 16: JP-A-2006-193687
Patent Document 17: JP-A-2006-243308

DISCLOSURE OF THE INVENTION

Problems to be Solved by the Invention

The present invention has been accomplished in order to solve the aforementioned problems involved in the background art, and an object of the invention is to provide a method for producing a polymer for semiconductor lithography employed for forming a resist film as well as thin films such as an anti-reflection film, a gap-filling film, a top coating film, etc. which are formed on or under a resist film, these films being employed in semiconductor lithography, wherein the method can attain high uniformity in the polymer from lot to lot.

Means for Solving the Problems

The present inventors have carried out extensive studies in order to attain the aforementioned object, and have found that the object can be attained by producing a target polymer through a specific method. The present invention has been accomplished on the basis of this finding.

Accordingly, the present invention provides a method for producing a polymer for semiconductor lithography including the step (P) of heating a polymerizable monomer and a polymerization initiator in a solvent, to thereby polymerize the monomer, the step (P) including the step of controlling a polymerization pressure employed therein by regulating the liquid level in a container (W0) which is disposed between a polymerization tank and the atmospheric air and which provides liquid sealing.

Effects of the Invention

According to the production method of the present invention, a polymer for semiconductor lithography can be produced with considerably reduced difference in Mw between production lots. Therefore, lithography films having a consistent thickness and lithographic characteristics can be formed from various production lots. Thus, high-precision lithographic patterns can be consistently formed, and large-scale integrated semiconductor devices can be fabricated at high yield.

DESCRIPTION OF THE REFERENCE NUMERALS

Figure 1:
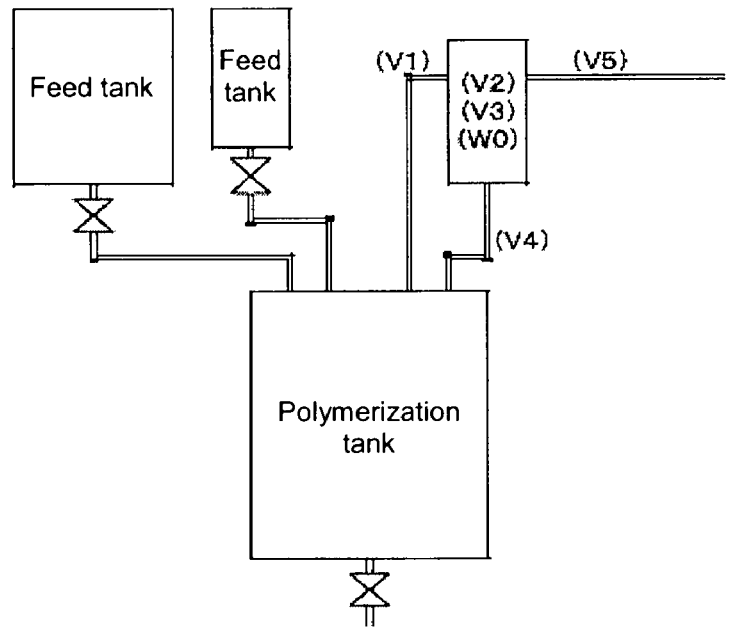
FIG. 1 An exemplary position of a liquid-sealable container (W0).
Figure 2:
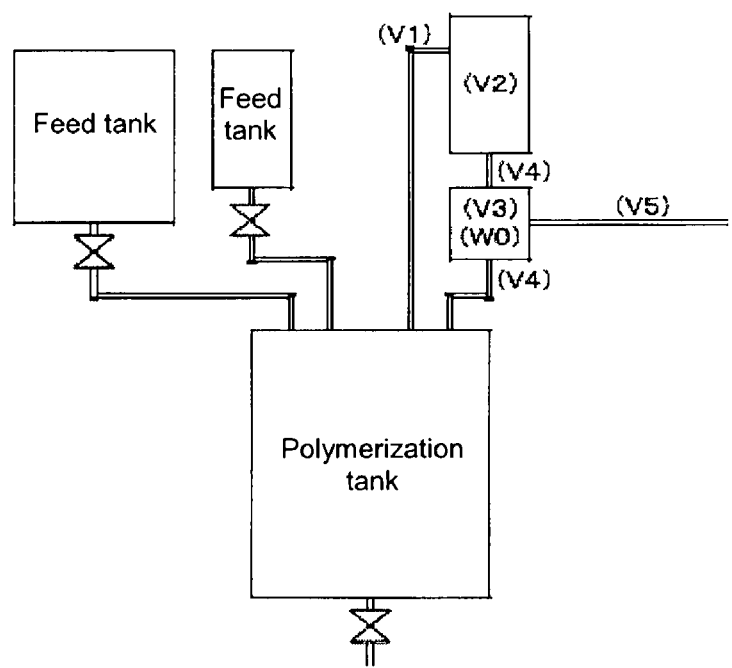
FIG. 2 An exemplary position of a liquid-sealable container (W0).
Figure 3:
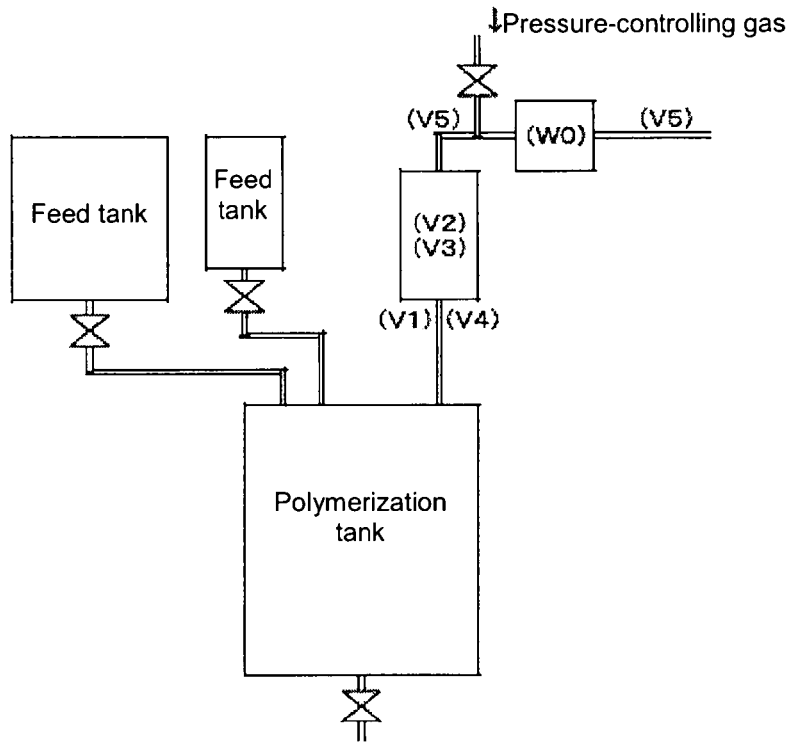
FIG. 3 An exemplary position of a liquid-sealable container (W0).
Figure 4:
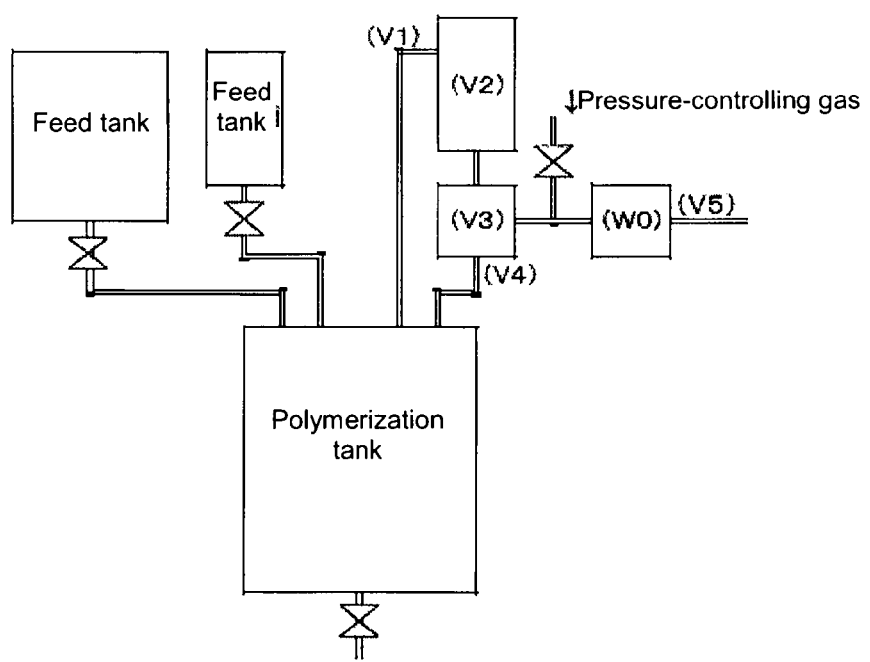
FIG. 4 An exemplary position of a liquid-sealable container (W0).
Figure 5:
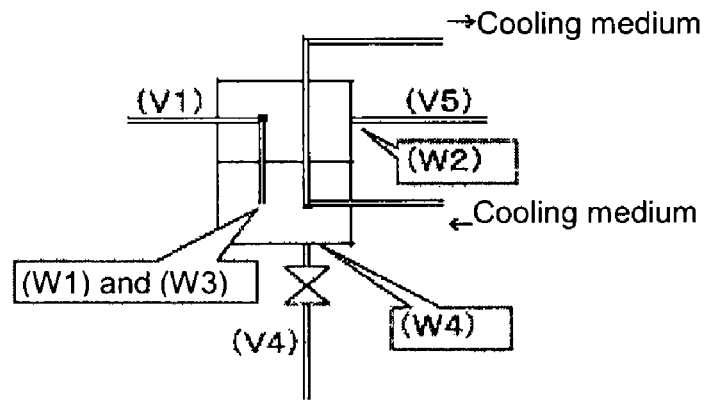
FIG. 5 An exemplary structure of the liquid-sealable container (W0) shown in FIG. 1.
Figure 6:
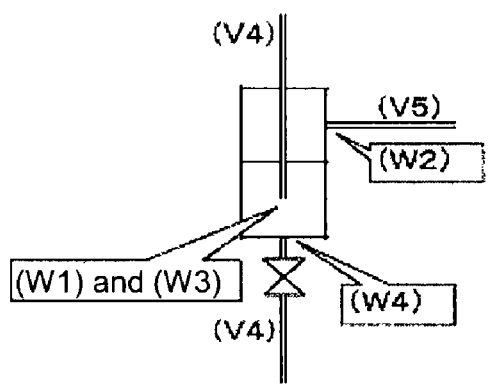
FIG. 6 An exemplary structure of the liquid-sealable container (W0) shown in FIG. 2.
Figure 7:
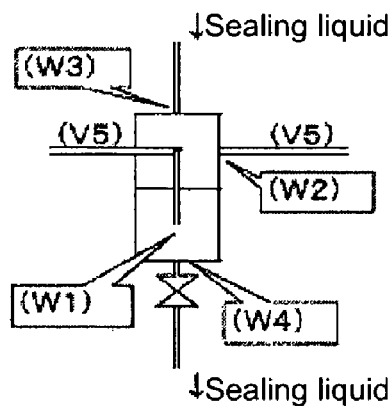
FIG. 7 An exemplary structure of the liquid-sealable container (W0) shown in FIG. 3.
Figure 8:
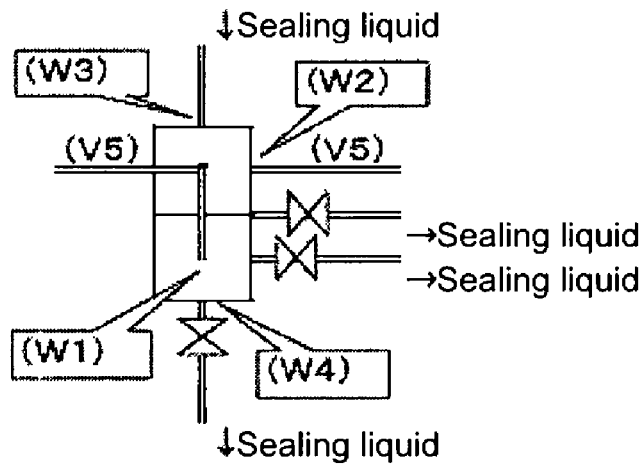
FIG. 8 An exemplary structure of the liquid-sealable container (W0) shown in FIG. 4.
Figure 9:
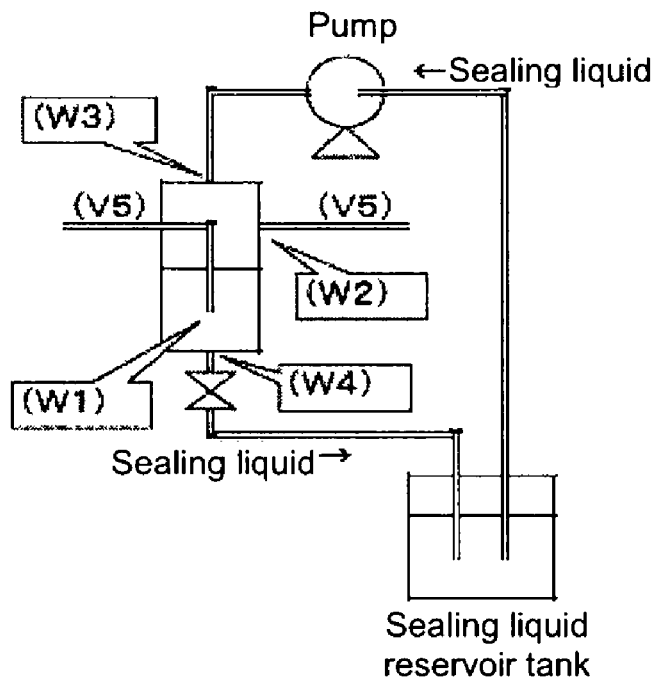
FIG. 9 An exemplary configuration of apparatuses in the case where the sealing liquid of the liquid-sealable container (W0) is externally circulated.

| | |
|---|---|
| W0: | Liquid-sealable container |
| W1: | Gas inlet |
| W2: | Gas outlet |
| W3: | Sealing liquid inlet |
| W4: | Sealing liquid outlet |
| V1: | Vapor line |
| V2: | Condenser |
| V3: | Gas-liquid separation tank |
| V4: | Reflux line |
| V5: | Gas-discharge line |

BEST MODES FOR CARRYING OUT THE INVENTION

The production method of the present invention includes the step (P) of heating a polymerizable monomer and a polymerization initiator in a solvent, to thereby polymerize the monomer, wherein the polymerization pressure employed in the step is controlled by regulating the liquid level of a liquid seal portion disposed between a polymerization tank and the atmospheric air. The step (P) is preferably performed through dropwise addition of a monomer, a polymerization initiator, and an optional chain-transfer agent to a heated solvent for polymerization. The polymerization temperature is preferably adjusted to a temperature equal to or higher than the initial boiling point of the component serving as polymerization solvent. If necessary, the step (P) may be carried out in combination with, for example, a step (Q) of converting a polar group of the polymer to another polar group (i.e., protecting or deprotecting a polar group of the polymer); a step (R) of removing, from the polymer, unwanted substances such as unreacted substances (e.g., monomers or a polymerization initiator) or low-molecular-weight components (e.g., oligomers); a step (S) of removing low-boiling-point impurities or replacing the original solvent with a solvent suitable for a subsequent step or lithography; a step (T) of reducing the amount of metal impurities which are undesirable for fabrication of a semiconductor; or a step (U) of reducing the amount of substances (e.g., microgel) which may cause pattern defects. Hereinafter, the present invention will be described in more detail.

1. Step (P)

(1) Monomers

The monomer employed in the present invention is a polymerizable monomer which provides a repeating unit having a function required for a target lithography film. The monomer is selected from among known polymerizable monomers. Preferably, at least one monomer is selected from among a monomer (A) having a hydroxyl group, a monomer (B) having a structure in which a hydroxyl group is protected by a group which inhibits dissolution in an alkaline developer and which dissociates by the action of an acid (hereinafter may be referred to as an "acid-dissociable dissolution-inhibitive group"), a monomer (C) having a lactone structure, and a monomer (D) having a cyclic ether structure. If required, there may be employed an additional monomer, for example, a monomer (E) having a structure which inhibits dissolution of the polymer in an alkaline developer and is stable to the action of acid (hereinafter such a structure may be referred to as "acid-stable dissolution-inhibitive structure").

For example, when the polymer is employed as a chemical amplification-type positive resist film, the polymer is produced essentially from at least one member selected from monomers (A) and (C); monomer (B); and optionally monomer (E) in accordance with needs. When the polymer is employed as a negative resist film, the polymer is produced essentially from at least one member selected from monomers (A) and (D); and optionally at least one member selected from monomers (C) and (E) in accordance with needs. When the polymer is employed as an anti-reflection film or a top coating film for immersion lithography, the polymer is produced essentially from at least one member selected from monomers (A) and (D); and optionally at least one member selected from monomers (B), (C), and (E) in accordance with needs.

(1-A) Monomer (A)

Monomer (A), having a hydroxyl group, provides a repeating unit which enhances adhesion of the polymer to a substrate or an underlying film, which controls solubility of the polymer in a solvent for lithography or an alkaline developer, or which reacts with a curing agent to form a cross-linking structure. The hydroxyl group may be linked to a linear, branched, or cyclic hydrocarbon group which may be substituted by halogen, a carbonyl group, a sulfonyl group, etc. Specific examples of such groups include phenolic hydroxyl groups, alcoholic hydroxyl groups, fluoroalcoholic hydroxyl groups, a carboxyl group, and a sulfo group. Among them, phenolic hydroxyl groups, alcoholic hydroxyl groups, fluoroalcoholic hydroxyl groups, and a carboxyl group are preferred.

The monomer (A) particularly preferably has a structure represented by any of the formulas (A1) to (A3).

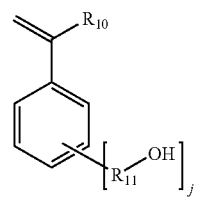

(A1)

In formula (A1), $R_{10}$ represents a hydrogen atom or a C1-C4 hydrocarbon group which may be substituted by a fluorine atom; specifically, a hydrogen atom or a C1-C4 alkyl group which may be substituted by a fluorine atom, such as methyl, ethyl, n-propyl, i-propyl, n-butyl, i-butyl, or trifluoromethyl, with a hydrogen atom, methyl, or trifluoromethyl being preferred; $R_{11}$ represents a single bond or a C1-C4 divalent hydrocarbon group which may be substituted by a fluorine atom; specifically, a single bond, or a C1-C4 alkylene group which may be substituted by a fluorine atom such as methylene, 1,1-ethylene, 2,2-propylene, 1,1,1,3,3,3-hexafluoro-2,2-propylene, or 1,1,1-trifluoro-2-trifluoromethyl-2,3-propylene, with a single bond, 1,1,1,3,3,3-hexafluoro-2,2-propylene, or 1,1,1-trifluoro-2-trifluoromethyl-2,3-propylene being preferred and a single bond being particularly preferred; and i is an integer of 1 or 2.

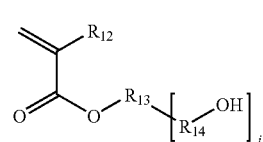

(A2)

In formula (A2), $R_{12}$ represents a hydrogen atom or a C1-C4 hydrocarbon group which may be substituted by a fluorine atom; specifically, a hydrogen atom or a C1-C4 alkyl group which may be substituted by a fluorine atom such as methyl, ethyl, n-propyl, i-propyl, n-butyl, i-butyl, or trifluoromethyl, with a hydrogen atom, methyl, or trifluoromethyl being preferred; $R_{13}$ represents a C2-C12 2- to 4-valent hydrocarbon group which may include a fluorine atom, an oxygen atom, or a sulfur atom; specifically, a C2-C4 linear or branched saturated hydrocarbon group such as ethylene or isopropylene, and a C5-C12 saturated alicyclic hydrocarbon group which may include an oxygen atom or a sulfur atom, having, for example, a cyclohexane ring, a norbornane ring, a 7-oxa-norbornane ring, a 7-thia-norbornane ring, an adamantane ring, or a tetracyclo[4.4.0.1$^{2,5}$.1$^{7,10}$]dodecane ring, with a cyclohexane ring, a norbornane ring, or an adamantane ring being preferred; $R_{14}$ represents a single bond or a C1-C4 divalent hydrocarbon group which may be substituted by a fluorine atom; specifically, a single bond, or a C1-C4 alkylene group which may be substituted by a fluorine atom such as methylene, 1,1-ethylene, 2,2-propylene, 1,1,1,3,3,3-hexafluoro-2,2-propylene, or 1,1,1-trifluoro-2-trifluoromethyl-2,3-propylene, with a single bond, 1,1,1,3,3,3-hexafluoro-2,2-propylene, or 1,1,1-trifluoro-2-trifluoromethyl-2,3-propylene being preferred, and a case in which $R_{13}$ is an adamantyl group and $R_{14}$ is a single bond being particularly preferred; and j is an integer of 1 to 3.

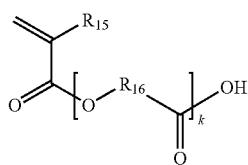
(A3)

In formula (A3), $R_{15}$ represents a hydrogen atom or a C1-C4 hydrocarbon group which may be substituted by a fluorine atom; specifically, a hydrogen atom or a C1-C4 alkyl group which may be substituted by a fluorine atom, such as methyl, ethyl, n-propyl, i-propyl, n-butyl, i-butyl, or trifluoromethyl, with a hydrogen atom, methyl, or trifluoromethyl being preferred; $R_{16}$ represents a C6-C12 divalent alicyclic hydrocarbon group which may include an oxygen atom or a sulfur atom; specifically, a saturated alicyclic hydrocarbon group which may include an oxygen atom or a sulfur atom, having, for example, a norbornane ring, a 7-oxa-norbornane ring, a 7-thia-norbornane ring, or a tetracyclo[4.4.0.1$^{2,5}$.1$^{7,10}$] dodecane ring, with a norbornane ring or a tetracyclo [4.4.0.1$^{2,5}$.1$^{7,10}$]dodecane ring being preferred; and k is an integer of 0 or 1.

Specific examples of monomer (A) will next be described. However, the present invention is not limited to those examples. Among specific monomers (A), one single or plural different members having different structures may be selected.

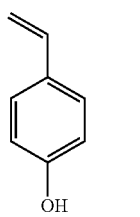
(A101)

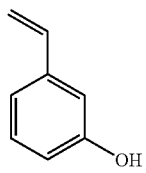
(A102)

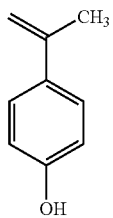
(A103)

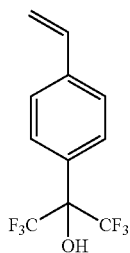
(A103)

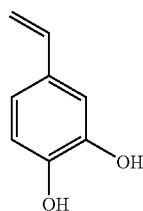
(A104)

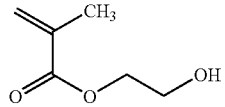
(A201)

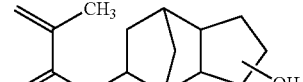
(A202)

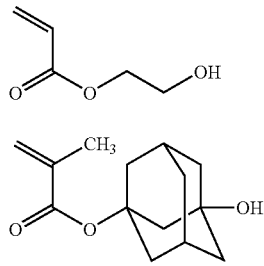
(A211)

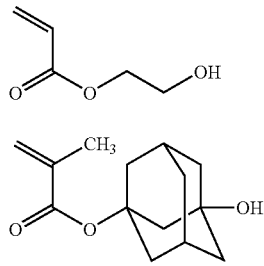
(A203)

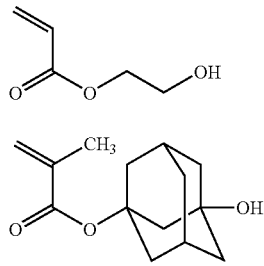
(A204)

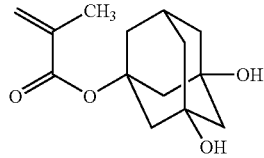
(A205)

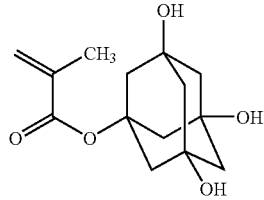
(A206)

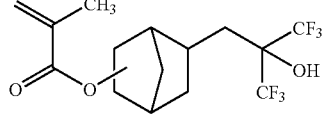
(A207)

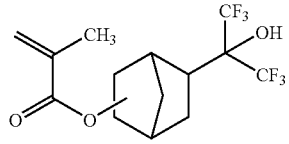
(A208)

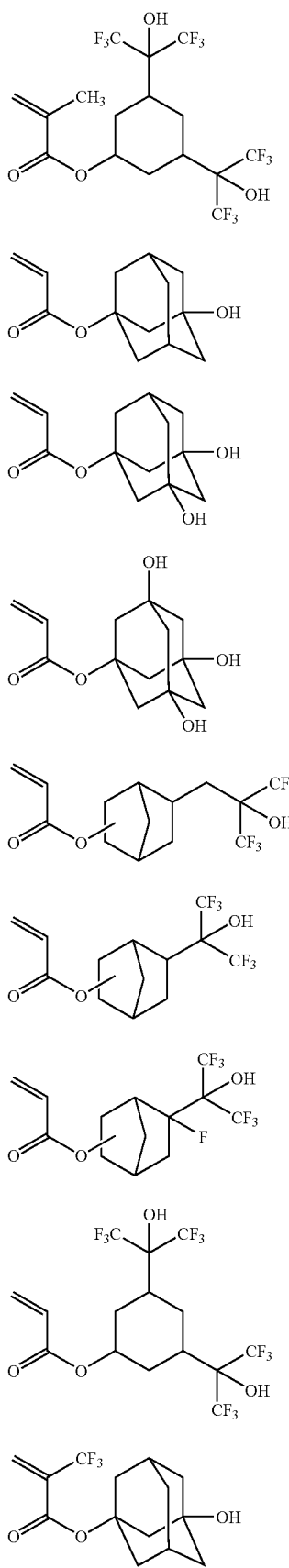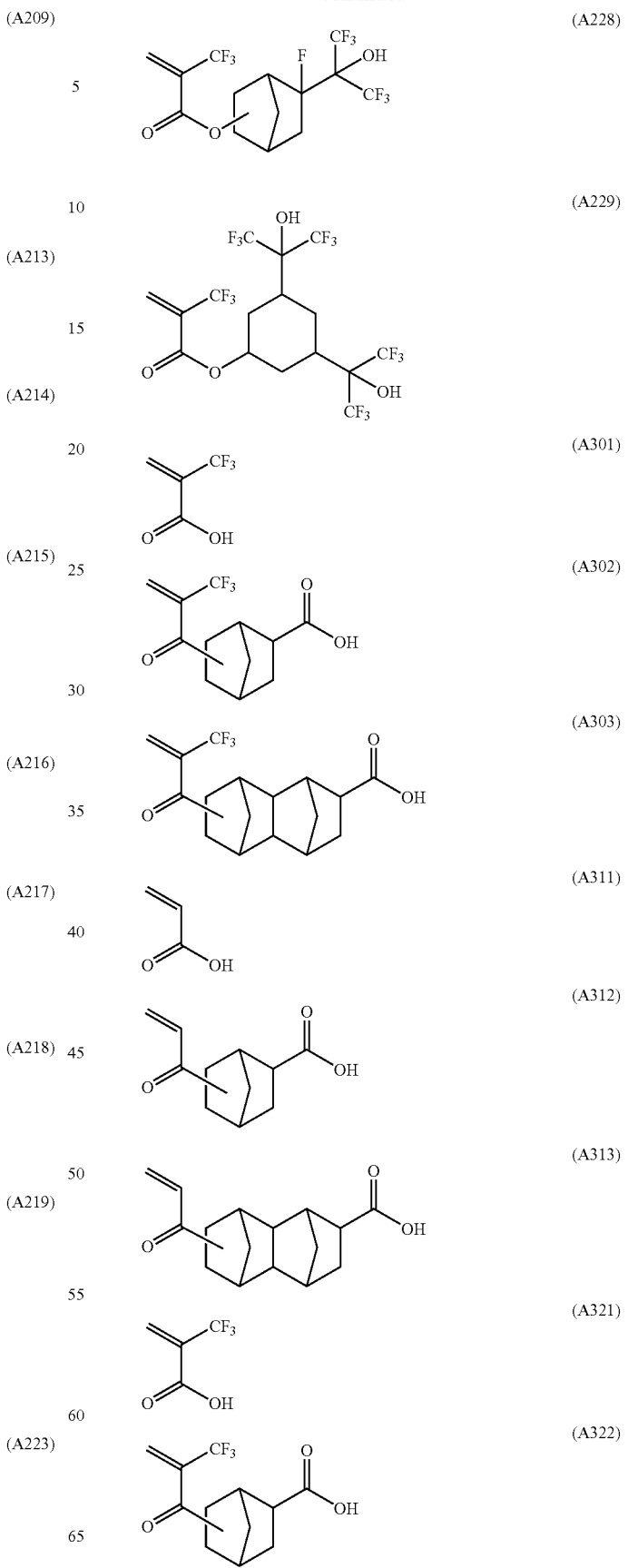

-continued

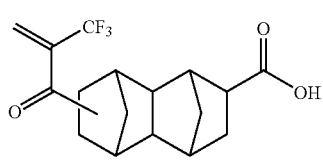
(A323)

(1-B) Monomer (B)

Monomer (B), having a structure in which a hydroxyl group is protected by an acid-dissociable dissolution-inhibitive group, provides a repeating unit which modifies the solubility of the polymer in an alkaline developer. Examples of preferred structures include those in which a hydroxyl group represented by formula (A1) to (A3) is protected by an acid-dissociable dissolution-inhibitive group represented by formula (b1) or (b2).

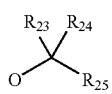
(b1)

In formula (b1), o represents a binding site of formula (b1). Each of $R_{23}$ and $R_{24}$ independently represents a C1-C4 hydrocarbon group, specifically, a C1-C4 alkyl group such as methyl, ethyl, n-propyl, i-propyl, n-butyl, or i-butyl. $R_{15}$ represents a C1-C12 hydrocarbon group, specifically, a C1-C12 linear, branched, or cyclic alkyl group such as methyl, ethyl, n-propyl, i-propyl, n-butyl, i-butyl, cyclopentyl, cyclohexyl, norbornyl, tricyclo[$5.2.1.0^{2,6}$]decanyl, adamantyl, or tetracyclo[$4.4.0.1^{2,5}.1^{7,10}$] dodecanyl. $R_{25}$ may be linked to $R_{23}$ or $R_{24}$ to form a ring, specifically, a $C_5$-$C_{12}$ saturated alicyclic ring such as a cyclopentane ring, a cyclohexane ring, a norbornane ring, a tricyclo[$5.2.1.0^{2,6}$]decane ring, an adamantane ring, or a tetracyclo[$4.4.0.1^{2,5}.1^{7,10}$]dodecane ring.

Particularly preferred is a case in which $R_{25}$ (or $R_{25}$ linked to $R_{23}$ or $R_{24}$) includes a saturated alicycle, specifically, a ring such as a cyclopentane ring, a cyclohexane ring, a norbornane ring, a tricyclo[$5.2.1.0^{2,6}$]decane ring, an adamantane ring, or a tetracyclo[$4.4.0.1^{2,5}.1^{7,10}$]dodecane ring, since a large difference in solubility in an alkaline developer is provided before and after lithography, which is preferred for making fine patterns.

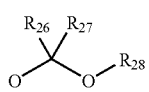
(b2)

In formula (b2), o represents a binding site of formula (b2) Each of $R_{26}$ and $R_{27}$ independently represents a hydrogen atom or a C1-C4 hydrocarbon group, specifically, a hydrogen atom or a C1-C4 alkyl group such as methyl, ethyl, n-propyl, i-propyl, n-butyl, or i-butyl. $R_{28}$ represents a C1-C12 hydrocarbon group, specifically, a C1-C12 linear, branched, or cyclic alkyl group such as methyl, ethyl, n-propyl, i-propyl, n-butyl, i-butyl, t-butyl, 2-ethylhexyl, cyclopentyl, cyclohexyl, norbornyl, tricyclo[$5.2.1.0^{2,6}$] decanyl, adamantyl, or tetracyclo[$4.4.0.1^{2,5}.1^{7,10}$]dodecanyl. $R_{26}$ may be linked to $R_{27}$ or $R_{28}$ to form a ring. Specific examples of rings formed from $R_{26}$ and $R_{27}$ include a cyclopentane ring, a cyclohexane ring, a norbornane ring, a tricyclo[$5.2.1.0^{2,6}$]decane ring, an adamantane ring, and a tetracyclo[$4.4.0.1^{2,5}.1^{7,10}$]dodecane ring. Specific examples of a ring formed from $R_{26}$ and $R_{28}$ include a hydrofuran ring and a hydropyran ring.

Specific examples of monomer (B) will next be described. However, the present invention is not limited to those examples. Among specific monomers (B), one single or plural different members may be selected.

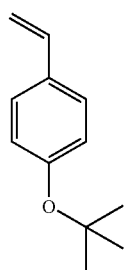
(B111)

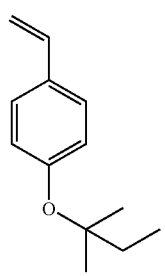
(B112)

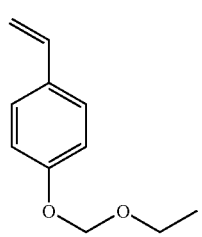
(B121)

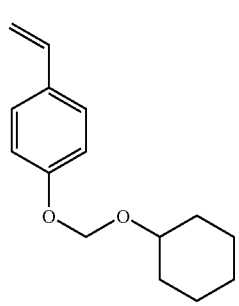
(B122)

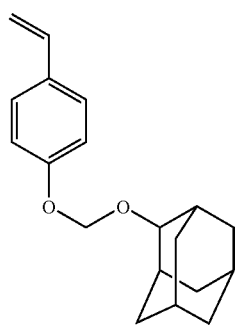
(B123)

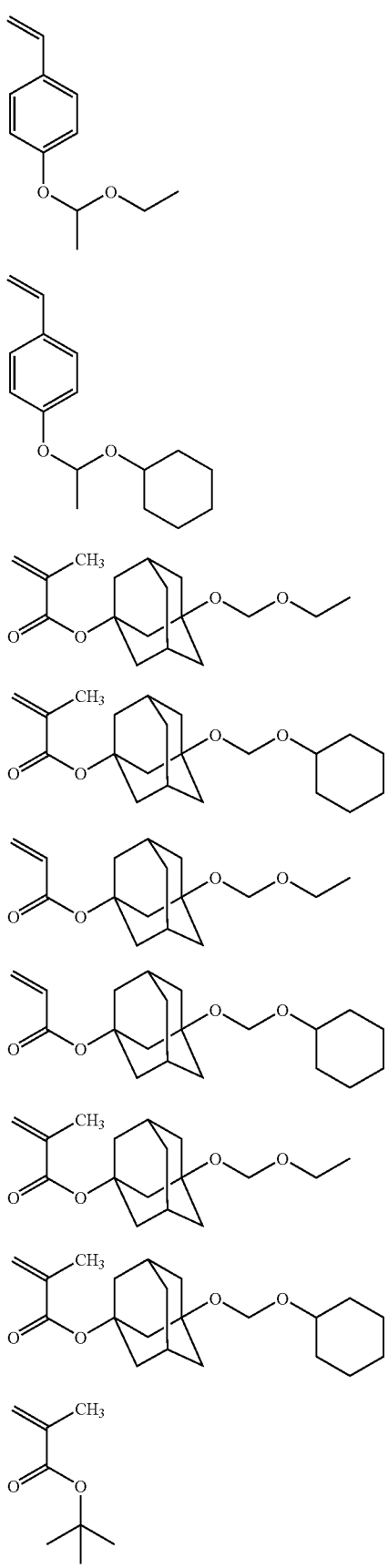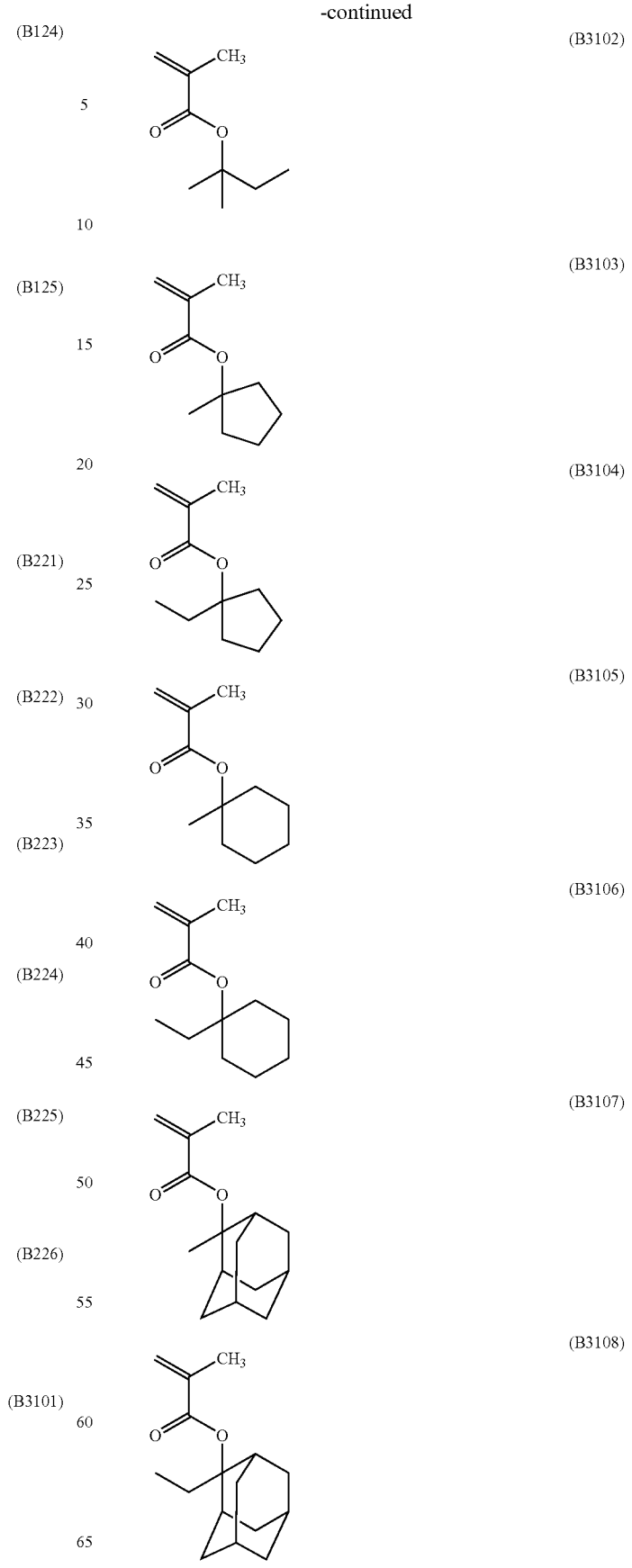

(B3109) 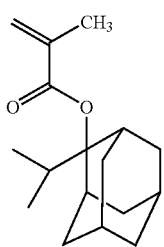
(B3110) 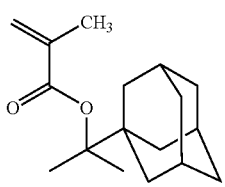
(B3111) 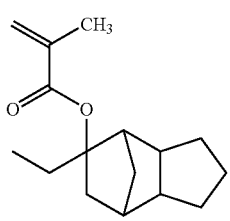
(B3112) 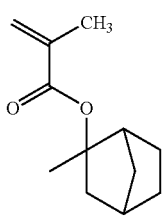
(B3113) 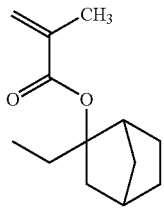
(B3114) 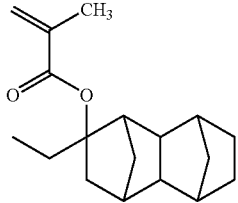
(B3121) 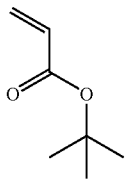
(B3122) 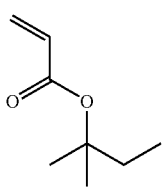
(B3123) 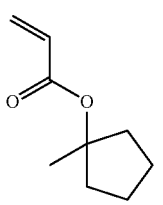
(B3124) 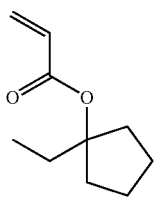
(B3125) 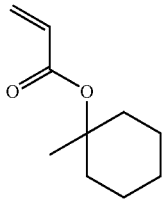
(B3126) 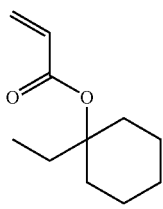
(B3127) 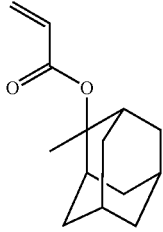
(B3128) 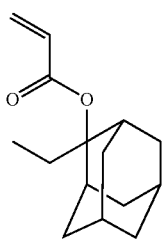

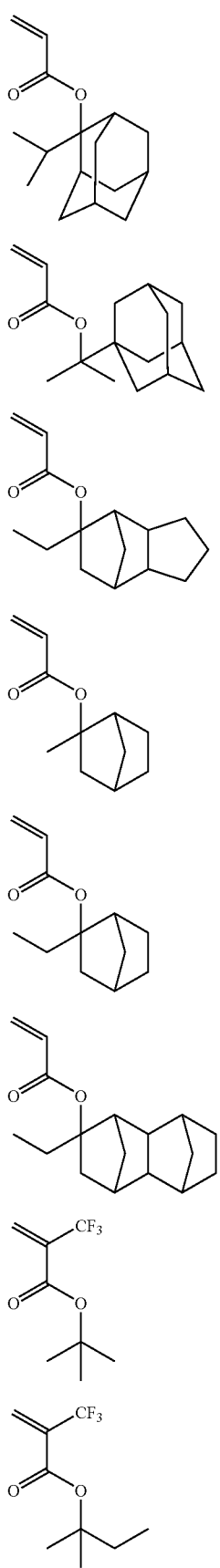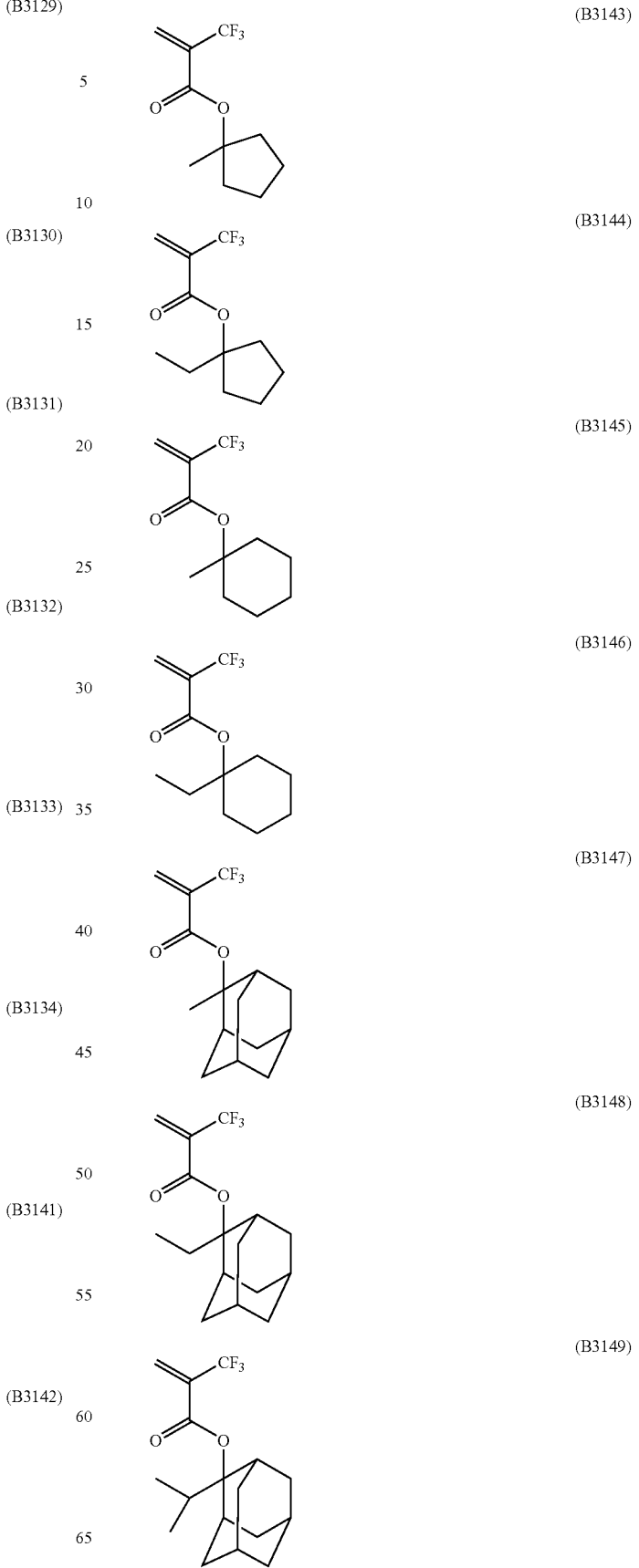

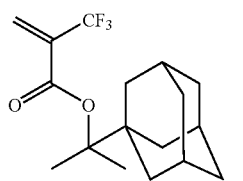 (B3150)
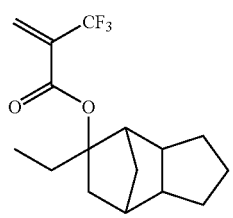 (B3151)
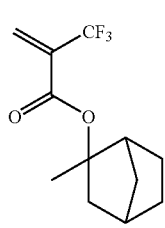 (B3152)
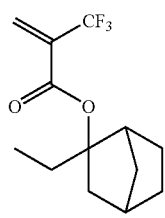 (B3153)
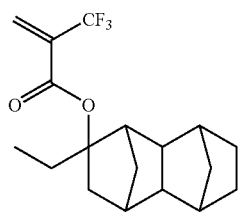 (B3154)
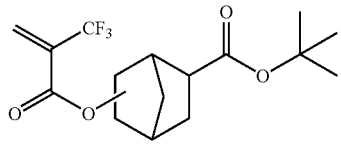 (B3161)
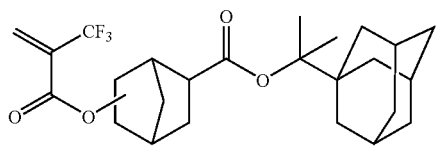 (B3162)
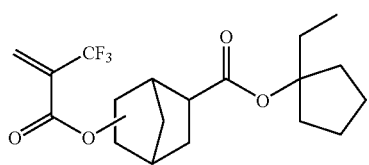 (B3163)
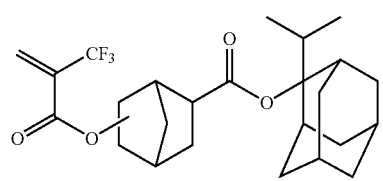 (B3164)
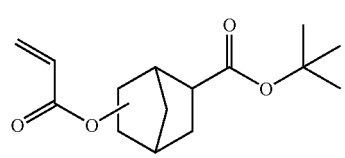 (B3171)
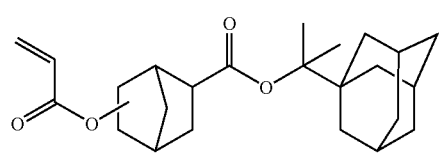 (B3172)
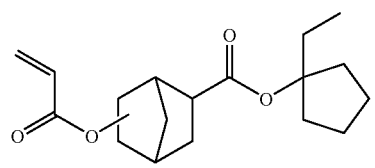 (B3173)
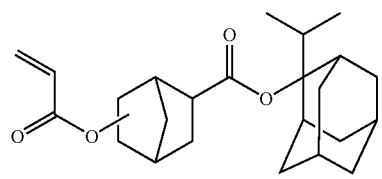 (B3174)
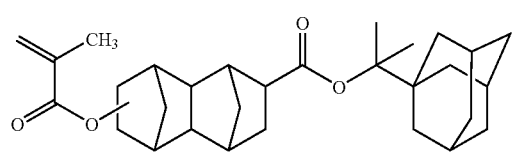 (B3181)
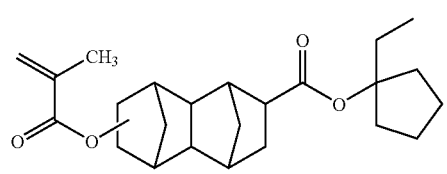 (B3182)
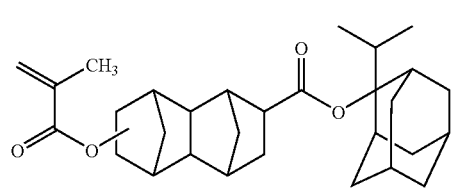 (B3183)
(B3184)

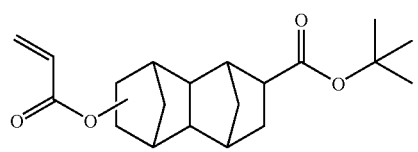
(B3191)
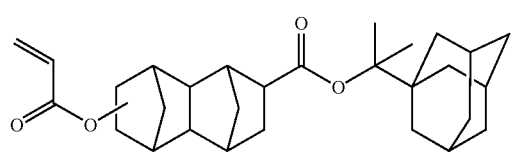
(B3192)
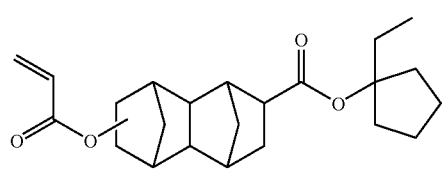
(B3193)
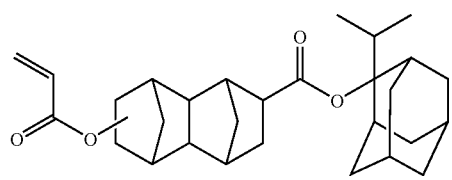
(B3194)
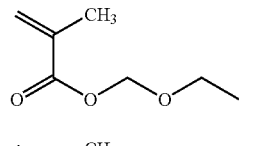
(B3201)
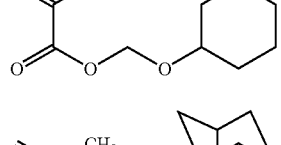
(B3202)
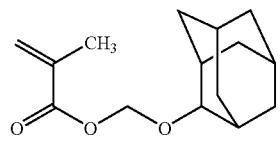
(B3203)
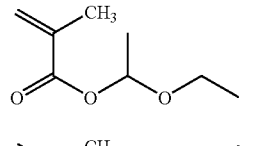
(B3204)
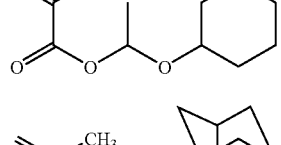
(B3205)
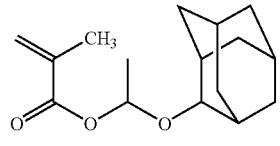
(B3206)
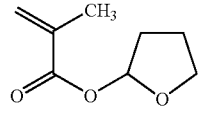
(B3207)
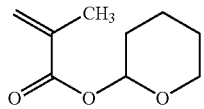
(B3208)
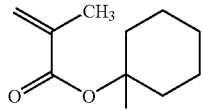
(B3209)
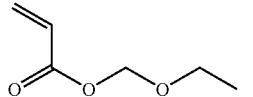
(B3211)
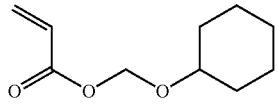
(B3212)
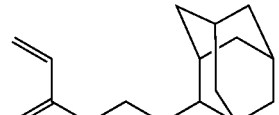
(B3213)
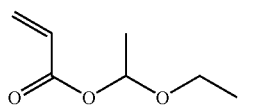
(B3214)
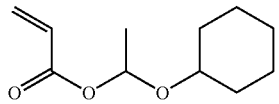
(B3215)
(B3216)
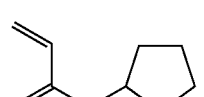
(B3217)
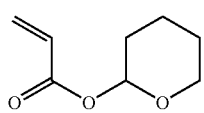
(B3218)
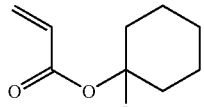
(B3219)
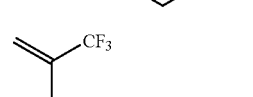
(B3221)
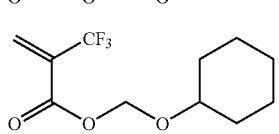
(B3222)

-continued
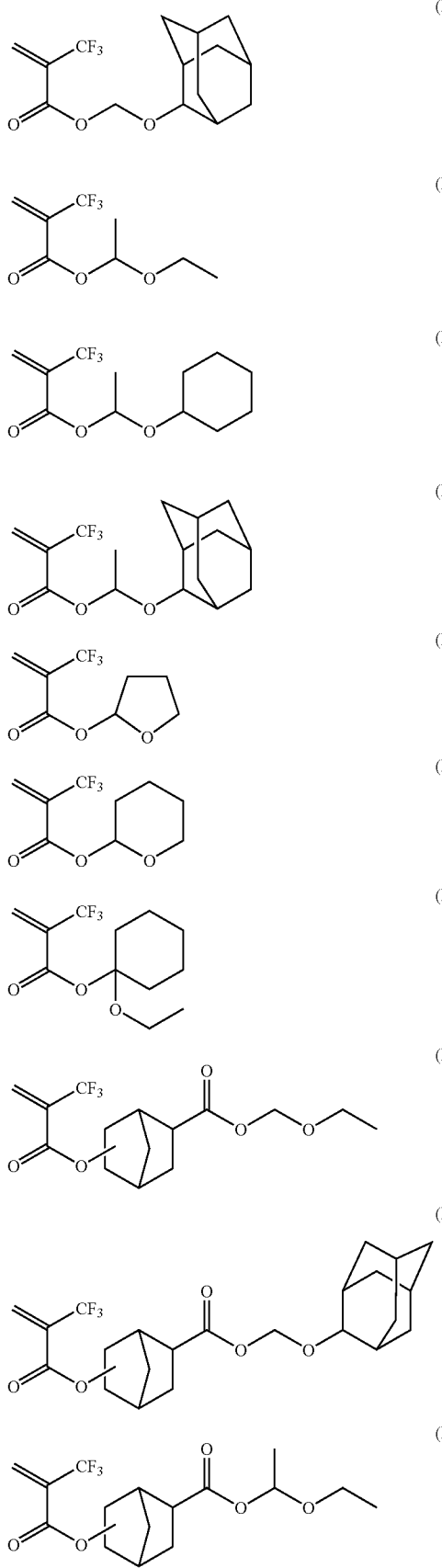
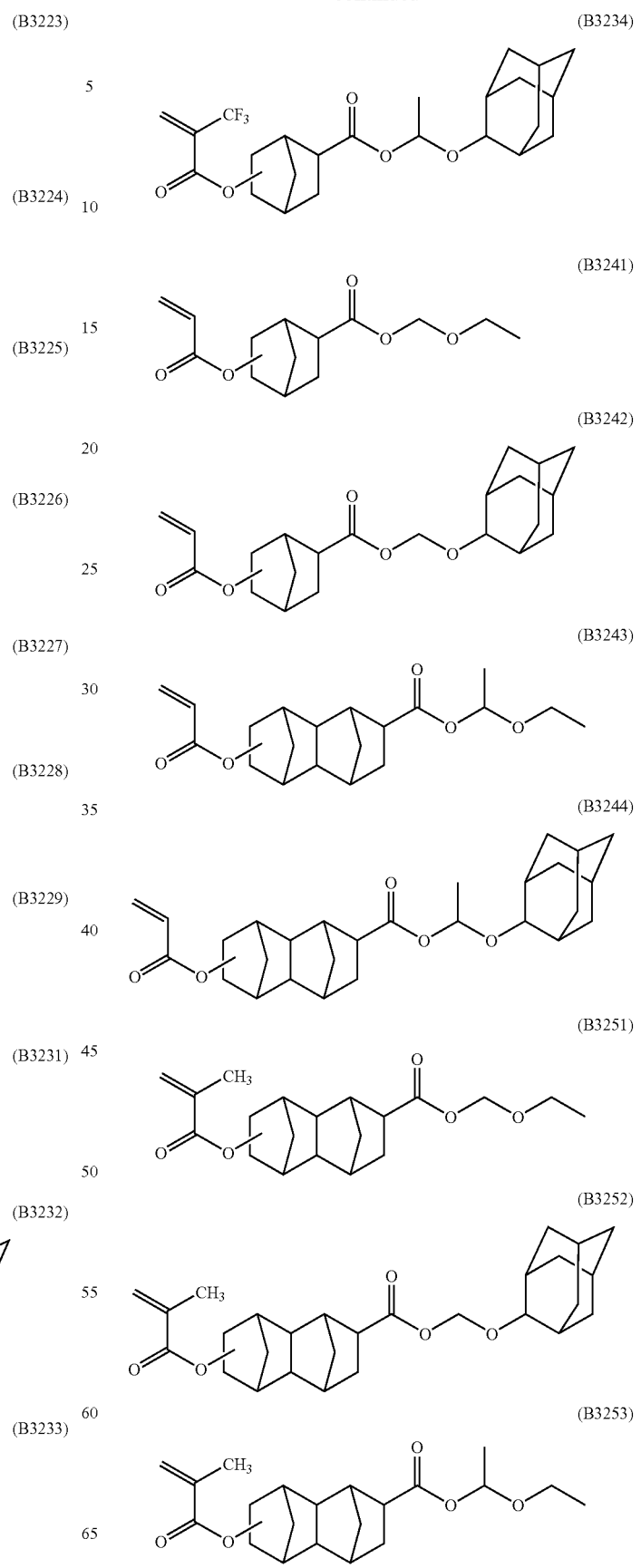

-continued

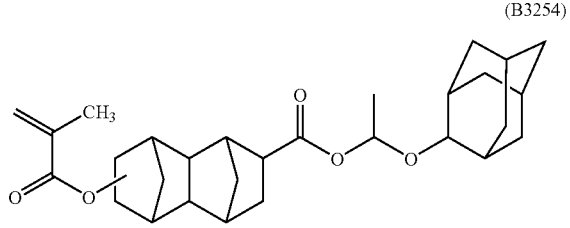
(B3254)

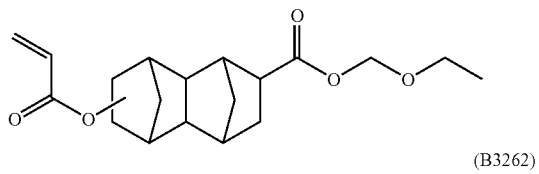
(B3261)

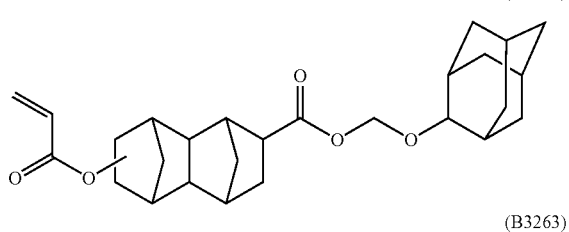
(B3262)

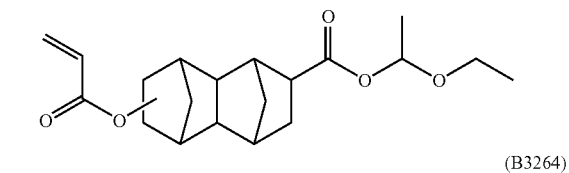
(B3263)

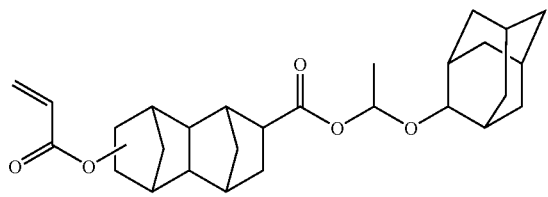
(B3264)

(1-C) Monomer (C)

Monomer (C), having a lactone structure, provides a repeating unit which enhances adhesion of the polymer to a substrate or a underlying film, and which controls the solubility of the polymer in a solvent for lithography or an alkaline developer. Examples of preferred monomers (C) include structures represented by formula (C1).

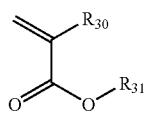
(C1)

In formula (C1), $R_{30}$ represents a hydrogen atom or a C1-C4 hydrocarbon group which may be substituted by a fluorine atom; specifically, a hydrogen atom or a C1-C4 alkyl group, such as methyl, ethyl, n-propyl, i-propyl, n-butyl, i-butyl, or trifluoromethyl. $R_{30}$ is preferably a hydrogen atom, a methyl group, or a trifluoromethyl group. $R_3$, represents a lactone-structure-including group represented by formula (c).

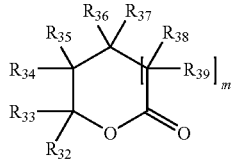
(c)

In formula (c), any one of $R_{32}$ to $R_{39}$ represents a single bond having a binding site of $R_{31}$, and the remaining ones of $R_{32}$ to $R_{39}$ each represent a hydrogen atom or a C1-C4 hydrocarbon or alkoxy group. Alternatively, any one of $R_{32}$ to $R_{39}$ represents a C3-C12 hydrocarbon group which may include an oxygen atom or a sulfur atom, the hydrocarbon group having a binding site of $R_3$, and being bonded to any one or two of the remaining ones of $R_{32}$ to $R_{39}$ to form a C5-C15 alicyclic ring; any one or two of the remaining ones of $R_{32}$ to $R_{39}$ represent a single bond for forming the aforementioned C5-C15 alicyclic ring; and the further remaining ones of $R_{32}$ to $R_{39}$ each represent a hydrogen atom or a C1-C4 hydrocarbon or alkoxy group. m is an integer of 0 or 1.

Specific examples of the alicyclic ring include a cyclopentane ring, a cyclohexane ring, a norbornane ring, a 7-oxa-norbornane ring, a 7-thia-norbornane ring, and a tetracyclo [$4.4.0.1^{2,5}.1^{7,10}$]dodecane ring. Of these, a norbornane ring and a 7-oxa-norbornane ring are preferred. Specific examples of the C1-C4 hydrocarbon group include methyl, ethyl, n-propyl, i-propyl, n-butyl, and i-butyl. Specific examples of the C1-C4 alkoxy group include methoxy and ethoxy.

The "m" is an integer of 0 or 1.

Examples of particularly preferred lactone structures in which any one of $R_{32}$ to $R_{39}$ represents a single bond having a binding site of $R_{31}$, and the remaining ones of $R_{32}$ to $R_{39}$ each represent a hydrogen atom or a C1-C4 hydrocarbon or alkoxy group, include 7-butyrolactone structures and δ-valerolactone structures. Examples of particularly preferred lactone structures in which any one of $R_{32}$ to $R_{39}$ represents a C3-C14 hydrocarbon group which may include an oxygen atom or a sulfur atom, said hydrocarbon group having a binding site of $R_{31}$ and being bonded to any one or two of the remaining ones of $R_{32}$ to $R_{39}$ to form a C5-C15 alicyclic ring; and the further remaining ones of $R_{32}$ to $R_{39}$ each represent a hydrogen atom or a C1-C4 hydrocarbon or alkoxy group, include 1,3-cyclohexanecarbolactone structures, 2,6-norbornanecarbolactone structures, 7-oxa-2,6-norbornanecarbolactone structures, and a 4-oxa-tricyclo[$5.2.1.0^{2,6}$]decane-3-one structure.

Specific examples of monomer (C) will next be described. However, the present invention is not limited to those examples. Among specific monomers (C), one single or plural different members may be selected.

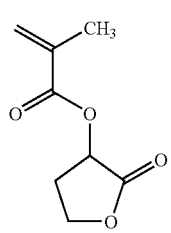
(C101)

(C102) 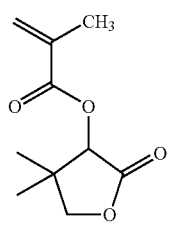
(C103) 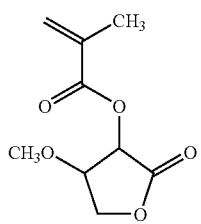
(C104) 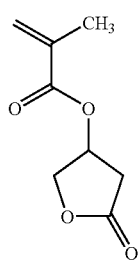
(C105) 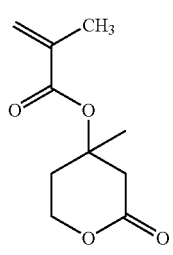
(C106) 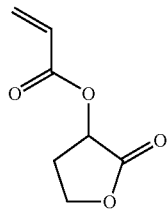
(C107) 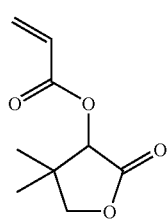
(C108) 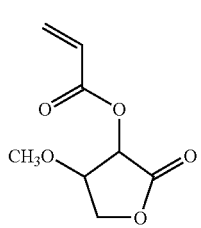
(C109) 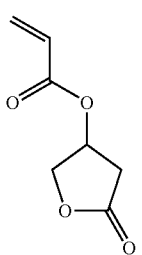
(C110) 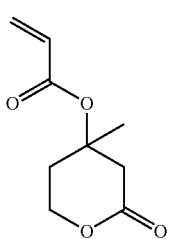
(C111) 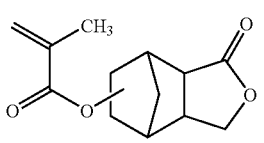
(C112) 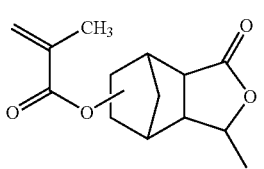
(C113) 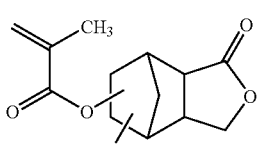
(C115) 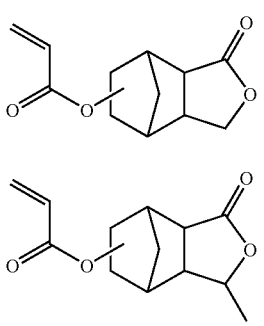
(C116) 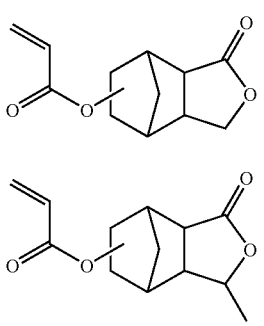
(C117) 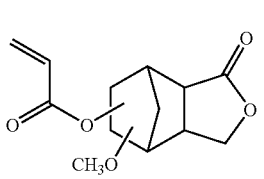
(C121) 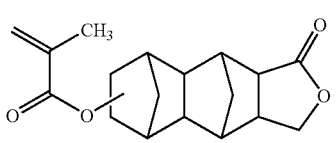

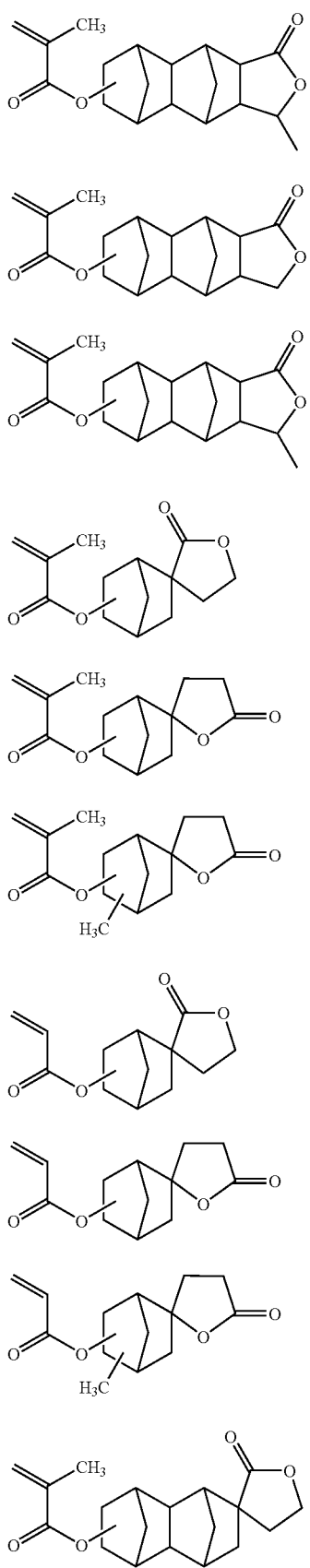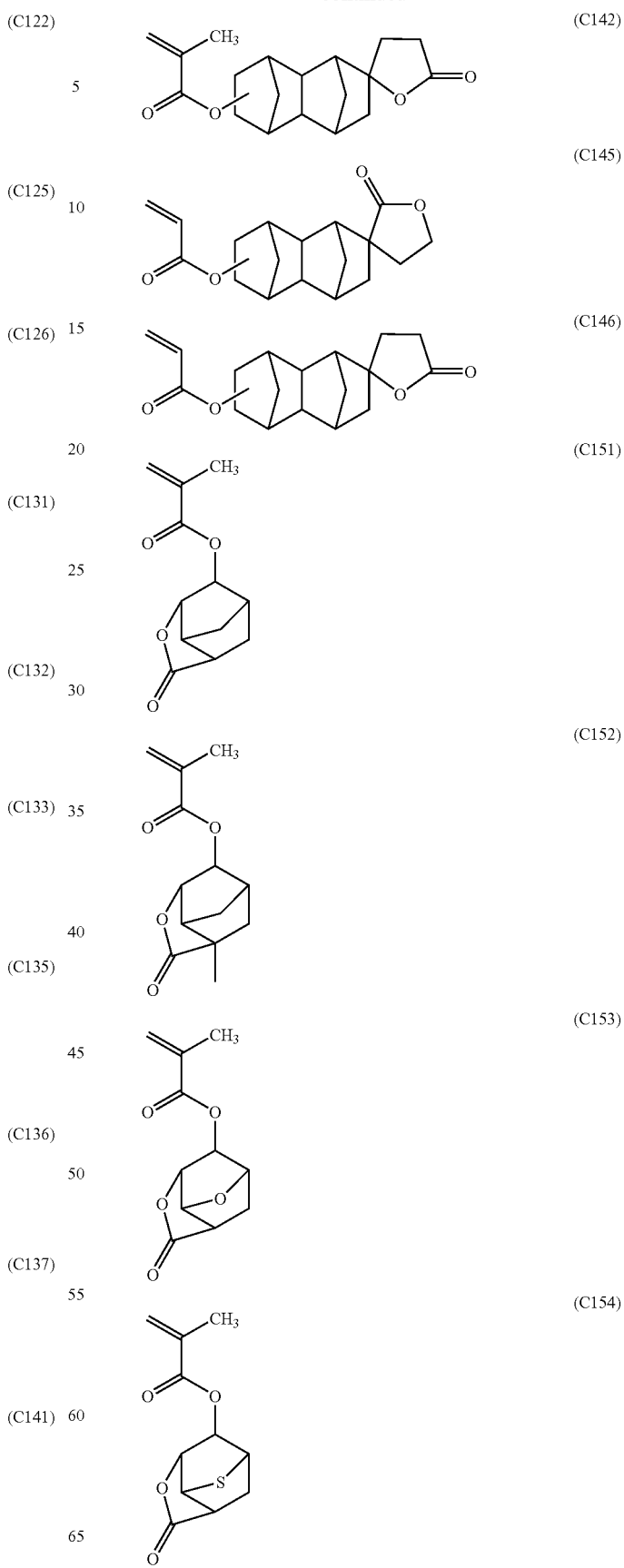

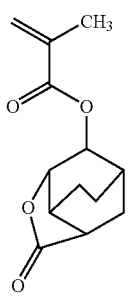 (C155)
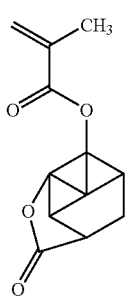 (C156)
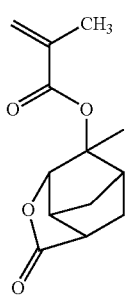 (C157)
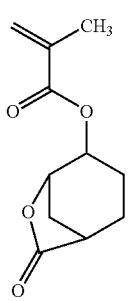 (C158)
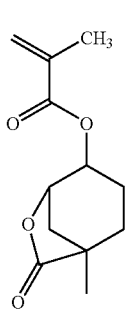 (C159)
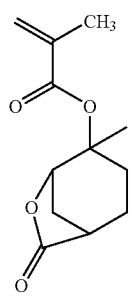 (C160)
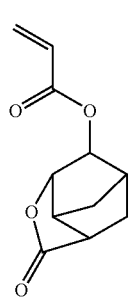 (C171)
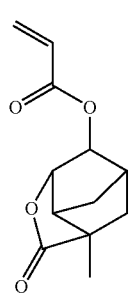 (C172)
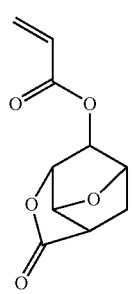 (C173)
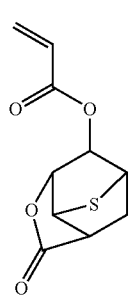 (C174)

(C175) 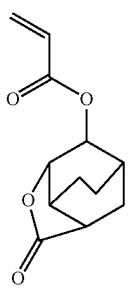

(C176) 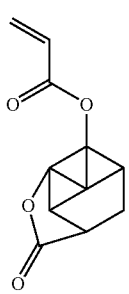

(C177) 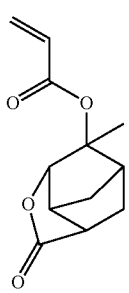

(C178) 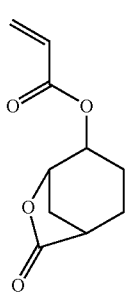

(C179) 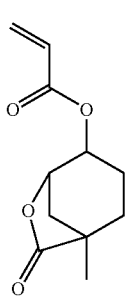

(C180) 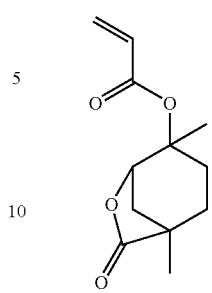

(1-D) Monomer (D)

Monomer (D), having a cyclic ether structure, provides a repeating unit which enhances adhesion of the polymer to a substrate or an underlying film, which controls the solubility of the polymer in a solvent for lithography or an alkaline developer, and which reacts with a curing agent to form a cross-linking structure. Preferred examples of monomers (D) include structures represented by formula (D1).

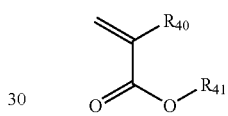

(D1)

In formula (D1), $R_{40}$ represents a hydrogen atom or a C1-C4 hydrocarbon group which may be substituted by a fluorine atom; specifically, a hydrogen atom or a C1-C4 alkyl group, such as methyl, ethyl, n-propyl, i-propyl, n-butyl, i-butyl, or trifluoromethyl, with a hydrogen atom, methyl, and trifluoromethyl being preferred. $R_{41}$ represents a C3-C7 hydrocarbon group having a 3- to 6-membered cyclic ether structure. Specific examples of the cyclic ether structure of the hydrocarbon group include an epoxy ring, an oxetane ring, a tetrahydrofuran ring, and a tetrahydropyran ring. Specific examples of such hydrocarbon groups include a glycidyl group, an oxetanylmethyl group, a tetrahydrofuranylmethyl group and a tetrahydropyranylmethyl group. Among them, a glycidyl group is particularly preferred.

Specific examples of monomer (D) will next be described. However, the present invention is not limited to those examples. Among specific monomers (D), one single or plural different members may be selected.

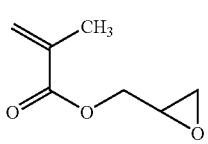

(D101)

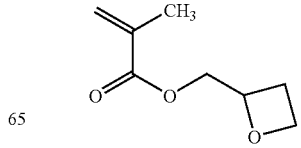

(D102)

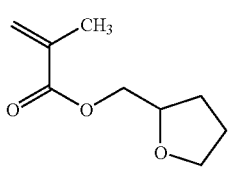
(D103)

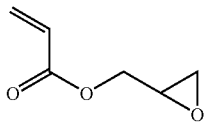
(D111)

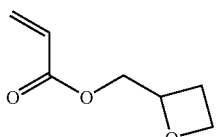
(D112)

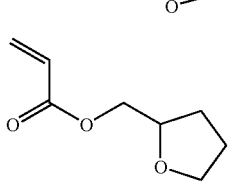
(D113)

(1-E) Monomer (E)

Monomer (E), having an acid-stable dissolution-inhibitive moiety, provides a repeating unit which controls the solubility of the polymer in a solvent for lithography or an alkaline developer, optical properties (e.g., refractive index and light transmittance) of the thin film of the polymer, etc. Examples of preferred monomer (E) include the following monomers (E1), (E2), and (E3), in which a hydrogen atom of a hydroxyl group represented by formula (A1), (A2), or (A3) has been substituted by an acid-stable dissolution-inhibitive group.

Examples of the acid-stable dissolution-inhibitive group in the monomers (E1) to (E3) include a carbon C1-C12 hydrocarbon group having a primary to tertiary carbon atom which is linked to an oxygen atom of the hydroxyl group through hydrogen atom substitution, and a structure having a 1-adamantyl group. Specific examples include C1-C12 linear, branched, or cyclic alkyl groups such as methyl, ethyl, n-propyl, i-propyl, n-butyl, i-butyl, cyclopentyl, cyclohexyl, 2-norbornyl, 2-isobornyl, 8-tricyclo[5.2.1.0$^{2,6}$]decanyl, 1-adamantyl, 2-adamantyl, and 4-tetracyclo[4.4.0.1$^{2,5}$.1$^{7,10}$]dodecanyl.

Another preferred example of the structure is monomer (E4) represented by formula (E4).

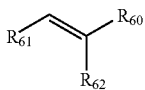
(E4)

In formula (E4), $R_{60}$ represents a hydrogen atom or a C1-C4 hydrocarbon group which may be substituted by a fluorine atom; specifically, a hydrogen atom or a C1-C4 alkyl group which may be substituted by a fluorine atom, such as methyl, ethyl, n-propyl, i-propyl, n-butyl, i-butyl, or trifluoromethyl, with a hydrogen atom, methyl, and trifluoromethyl being preferred. $R_{61}$ represents a hydrogen atom, a single bond which binds to $R_{62}$, or a C1 to C4 hydrocarbon group. Specific examples include a hydrogen atom, a single bond, methylene, ethylene, and isopropylene. $R_{62}$ represents a C6 to C14 aromatic hydrocarbon group. Specific examples include a benzene ring, a naphthalene ring, and an anthracene ring.

Specific examples of monomer (E) will next be described. However, the present invention is not limited to those examples. Among specific monomers (E), one single or plural different members may be selected.

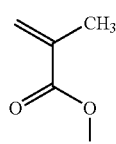
(E101)

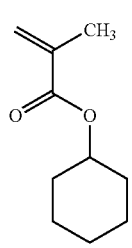
(e9102)

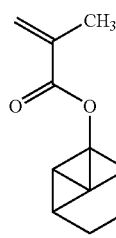
(E103)

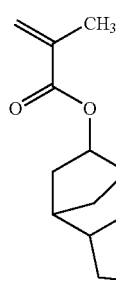
(E104)

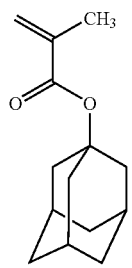
(E105)

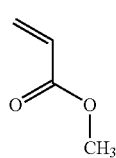
(E111)

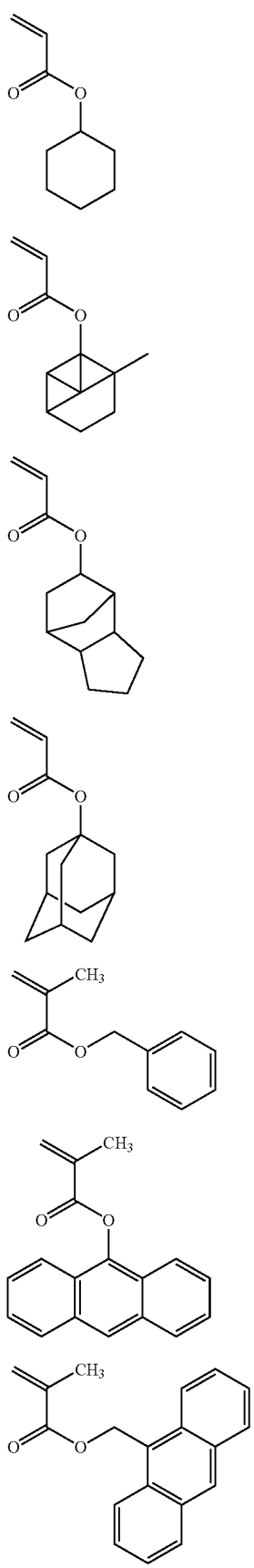
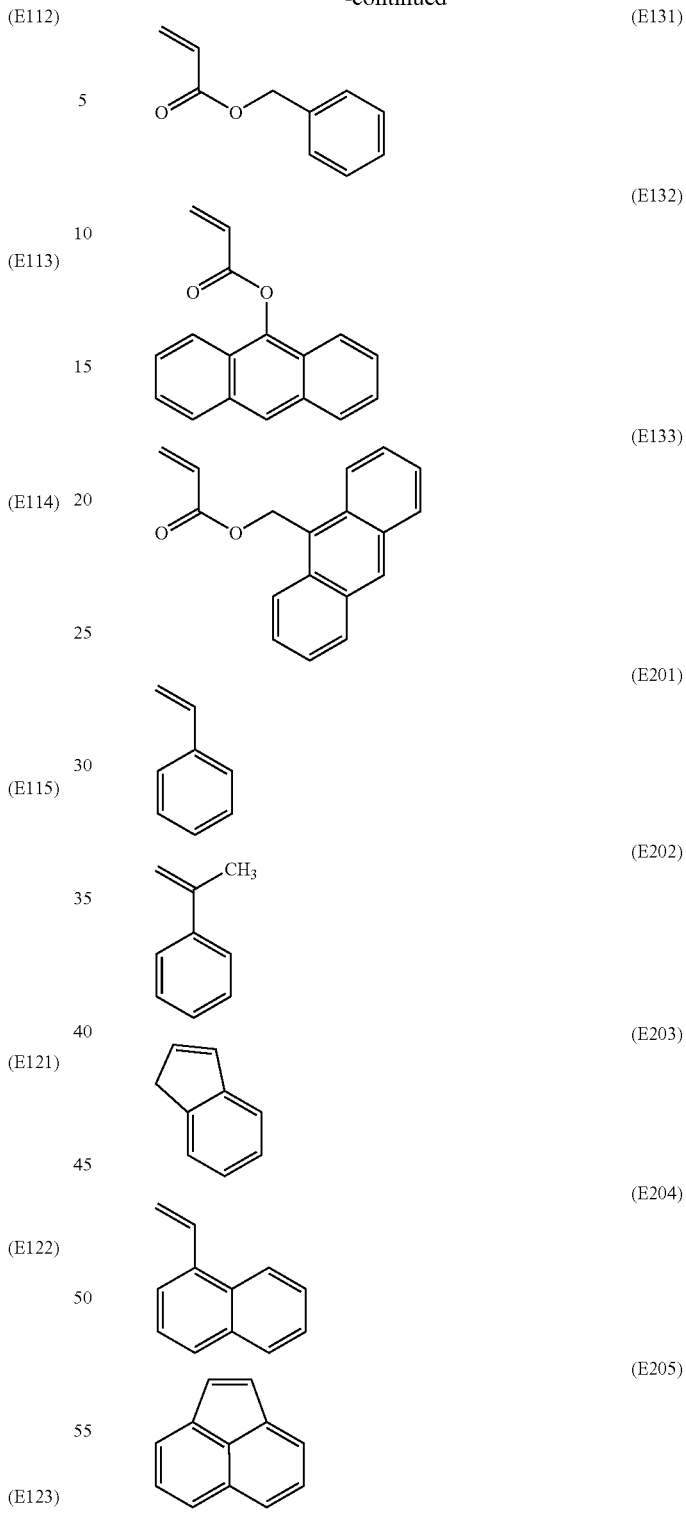

(2) Polymerization Initiator

The polymerization initiator employed may be a known radical polymerization initiator and is preferably a radical polymerization initiator such as an azo compound or a peroxide. Specific examples of the azo compound include 2,2'-azobisisobutyronitrile, 2,2'-azobis(2-methylbutyronitrile), dimethyl 2,2'-azobisisobutyrate, 1,1'-azobis(cyclohexane-1-carbonitrile), and 4,4'-azobis(4-cyanovaleric acid). Specific examples of the peroxide include decanoyl peroxide, lauroyl peroxide, benzoyl peroxide, bis(3,5,5-trimethylhexanoyl) peroxide, succinic acid peroxide, tert-butyl peroxy-2-ethylhexanoate, tert-butyl peroxypivalate, and 1,1,3,3-tetramethylbutyl peroxy-2-ethylhexanoate. Of these, azo compounds are particularly preferred, form the viewpoint of safety in handling. These polymerization initiators may be employed singly or in combination. The amount of a polymerization initiator employed may be determined in consideration of target Mw, the types and compositional proportions of monomers (i.e., raw materials), the polymerization initiator, a chain-transfer agent, and a solvent, and production conditions (e.g., polymerization temperature and dropwise addition technique).

(3) Chain-transfer Agent

Any known chain-transfer agent may optionally be employed. Particularly, a thiol compound is preferably employed, and the thiol compound employed may be selected from among a variety of known thiol compounds. Specific examples include t-dodecyl mercaptan, mercaptoethanol, mercaptoacetic acid, and mercaptopropionic acid. The amount of a chain-transfer agent employed may be determined in consideration of target Mw, the types and compositional proportions of monomers (i.e., raw materials), the polymerization initiator, the chain-transfer agent, and the solvent, and production conditions (e.g., polymerization temperature and dropwise addition technique). The chain-transfer agent may be mixed with monomers or a polymerization initiator, followed by dropwise addition, or may be dissolved in a heated solvent in advance.

(4) Solvent

No particular limitation is imposed on the polymerization solvent employed, so long as it can dissolve a monomer, a polymerization initiator, a chain-transfer agent, and a polymer produced through polymerization. A single solvent or a combination of two or more solvents may be used. However, preferably, at least one compound having a boiling point lower than that of the monomer is employed. In addition, through employment of solvent components singly or in combination so that the initial boiling point at polymerization pressure is adjusted to be equal to or lower than the polymerization temperature, heat generated during polymerization reaction can be merged into the latent heat of vaporization of a solvent component(s), whereby the polymerization temperature is maintained at a constant level. Such a mode is particularly preferred, since the difference in polymerization temperature between production lots can be minimized, whereby the difference in Mw between production lots can be reduced.

Specific examples of the compound which can be employed as a solvent include ketones such as acetone, methyl ethyl ketone, methyl isoamyl ketone, methyl amyl ketone, and cyclohexanone; alcohols such as methanol, ethanol, and isopropanol; ether alcohols such as ethylene glycol monomethyl ether, ethylene glycol monoethyl ether, ethylene glycol monobutyl ether, propylene glycol monomethyl ether, and 3-methoxy-3-methyl-1-butanol; ether esters which are compounds obtained through esterification between the aforementioned ether alcohols and acids (e.g., acetic acid); esters such as methyl acetate, ethyl acetate, butyl acetate, methyl propionate, methyl 3-methoxypropionate, ethyl 3-ethoxypropionate, methyl lactate, ethyl lactate, and γ-butyrolactone; ethers such as tetrahydrofuran, 1,4-dioxane, ethylene glycol dimethyl ether, and diethylene glycol dimethyl ether; aromatic hydrocarbons such as toluene and xylene; amides such as N,N-dimethylformamide and N-methylpyrrolidone; dimethyl sulfoxide; and acetonitrile. These solvents may be employed singly or in combination of two or more species.

(5) Structure of Polymer

The repeating unit composition of the polymer (hereinafter, the term "polymer" also refers to "copolymer") produced in the present invention varies depending on the purpose of use of the thin film employed in semiconductor lithography. For example, when the polymer is employed for forming a chemical amplification-type positive resist film, repeating unit (A) and repeating unit (C) are employed in a total amount of 20 to 95 mol %, preferably 30 to 90 mol %, more preferably 40 to 85 mol %; repeating unit (B) is employed in an amount of 5 to 80 mol %, preferably 10 to 70 mol %, more preferably 15 to 60 mol %; and repeating unit (E) is employed in an amount of 0 to 50 mol %, preferably 0 to 40 mol %, more preferably 0 to 30 mol %. When the polymer is employed for forming a negative resist film, repeating unit (A) and repeating unit (D) are employed in a total amount of 50 to 100 mol %, preferably 60 to 100 mol %, more preferably 70 to 100 mol %; repeating unit (C) is employed in an amount of 0 to 50 mol %, preferably 0 to 40 mol %, more preferably 0 to 30 mol %; and repeating unit (E) is employed in an amount of 0 to 50 mol %, preferably 0 to 40 mol %, more preferably 0 to 30 mol %. When the polymer is employed for forming an anti-reflection film or a top coating film for immersion lithograpy, repeating unit (A) and repeating unit (D) are employed in a total amount of 5 to 80 mol %, preferably 10 to 70 mol %, more preferably 15 to 60 mol %; repeating unit (B) is employed in an amount of 0 to 50 mol %, preferably 0 to 40 mol %, more preferably 0 to 30 mol %; repeating unit (C) is employed in an amount of 0 to 50 mol %, preferably 0 to 40 mol %, more preferably 0 to 30 mol %; and repeating unit (E) is employed in an amount of 0 to 95 mol %, preferably 10 to 90 mol %, more preferably 20 to 85 mol %.

The polymer produced according to the present invention has an end structure derived from a compound employed as a polymerization initiator or a chain-transfer agent. For example, in the case of radical polymerization, the formed polymer has, at a polymerization initiation end thereof, a radical structure generated from a radical polymerization initiator. When a chain-transfer agent is employed, the polymer has, at a polymerization initiation end thereof, a radical structure generated from the chain-transfer agent. When chain transfer occurs in, for example, a solvent or a monomer, the polymer has, at a polymerization initiation end thereof, a radical structure generated from the solvent or monomer. When recombination is stopped through termination reaction, the polymer may have, at both ends thereof, polymerization initiation ends, whereas when disproportionation termination occurs, the polymer may have, at one end thereof, a polymerization initiation end, and, at the other end, an end structure derived from a monomer employed. When a polymerization terminator is employed, the polymer may have, at one end thereof, a polymerization initiation end, and, at the other end, an end structure derived from the polymerization terminator. Plural these initiation and termination reactions may occur in a single polymerization reaction system. In such a case, the polymer is in the form of a polymer mixture having plural end structures.

When the polymer produced according to the present invention has an excessively high weight average molecular weight (Mw), the polymer exhibits poor solubility in a resist solvent or an alkaline developer, whereas when the polymer has an excessively low Mw, the coating performance of the polymer serving as a resist is impaired. Therefore, the weight average molecular weight (Mw) preferably falls within a range of 1,000 to 50,000, more preferably 1,500 to 30,000, particularly preferably 2,000 to 20,000. The molecular weight distribution (Mw/Mn) preferably falls within a range of 1.0 to 5.0, more preferably 1.0 to 3.0, particularly preferably 1.2 to 2.5.

(6) Polymerization Method

The polymerization method employed in the present invention is so-called solution polymerization, in which a monomer, a polymerization initiator, and an optional chain-transfer agent are heated in a solvent. Radical solution polymerization employing a radical polymerization initiator is particularly preferred. As a technique for feeding a monomer and a polymerization initiator, there may be employed, for example, a technique (P1) in which a monomer and a polymerization initiator are dissolved together in a solvent optionally, and the resultant solution is added dropwise to a heated solvent for polymerization of the monomers (i.e., mixing-dropwise addition technique); a technique (P2) in which monomers and a polymerization initiator are separately dissolved in different solvents optionally, and the resultant solutions are separately added dropwise to a heated solvent for polymerization of the monomers (i.e., separate dropwise addition technique); or a technique (P3) in which a monomer is dissolved in a solvent together with a polymerization initiator, and the solution is heated as is for polymerization of the monomer (i.e., batch-type temperature elevation technique). When the batch-type temperature elevation technique (P3) is employed, a uniform temperature elevation rate is difficult to attain from lot to lot. Therefore, difference in Mw between lots attributed to variation in temperature elevation rate is difficult to minimize. Thus, the mixing-dropwise addition technique (P1) and the separate dropwise addition technique (P2) are preferred, since the techniques involve no temperature elevation step, and difference in Mw between lots attributed to variation in polymerization temperature is small.

In the mixing-dropwise addition technique (P1) and the separate dropwise addition technique (P2), a portion of the monomer may be incorporated in advance into a heated solvent. Alternatively, plural raw materials in droplets having different monomer compositions, polymerization initiator concentrations, or chain-transfer agent concentrations may be dropwise added, to thereby modify, for example, the added monomer composition and the compositional proportions of the raw material (monomer, polymerization initiator, and chain-transfer agent) with the period of time of addition.

When the mixing-dropwise addition technique (P1) is employed, a high-concentration unreacted monomer is likely to come into contact with low-concentration radicals in a reservoir for the monomer solution which is to be added dropwise to a polymerization system, and thus a polymer having a molecular weight of 100,000 or higher (high polymer), which is one cause for pattern defects, tends to be generated. In contrast, in the separate dropwise addition technique (P2), the monomer solution is not co-present with a polymerization initiator in a reservoir for the monomer solution, and the unreacted monomer concentration of the reaction system is during addition is low, whereby a high polymer cannot be formed. Therefore, the separate dropwise addition technique (P2) is particularly preferred as the polymerization method employed in the present invention.

In the separate dropwise addition technique (P2), the monomer solution and the initiator solution may be preliminarily mixed together just before the polymerization tank. However, particularly preferably, the two solutions are added dropwise to a heated solvent from individual reservoirs, since the mixture may generate a high polymer before starting of addition. The feed rate of the monomer solution and that of the initiator solution may be individually predetermined so that a polymer having a desired molecular weight distribution can be produced. Through modifying either one or both of the two liquid feed rates, polymers having a wide range of molecular weight distribution profile (a sharp distribution profile to a distribution with polydispersibility) can be produced with high reproducibility. In the case where the feed of the initiator solution is reduced in an initial stage of reaction and increased in a final stage of reaction, a polymer having relatively high molecular weight is formed in the initial reaction stage in which the radical concentration is low, whereby the formed polymer has polydispersibility in the molecular weight distribution profile. Alternatively, each feed rate may be varied non-stepwise or stepwise.

In the mixing-dropwise addition technique (P1) and the separate dropwise addition technique (P2), the amount of polymerization solvent initially fed to a reaction tank (hereinafter may be referred to as "initially fed solvent") may be at least a minimum amount which allows the polymerization system to be stirred. An excessively large amount of the solvent is not preferred, since the amount of monomer solution which can be fed to the reaction tank is reduced, thereby lowering production efficiency. Generally, the relative volume of polymerization solvent is ⅟30 or more, with respect to the amount of the reaction system (at the end of feeding, i.e.; the total amount of initially fed solvent, added monomer solution, and added initiator solution), preferably ⅟20 to ½, particularly preferably ⅟10 to ⅓. A portion of the monomer solution may be added to the initially fed solvent.

In the mixing-dropwise addition technique (P1) and the separate dropwise addition technique (P2), when a low-temperature monomer solution is added dropwise to a polymerization system, the system is locally cooled, where the monomer concentration is elevated, and the radical concentration is lowered. Under such conditions, a high polymer is possibly formed, which is not preferred. Therefore, the monomer solution is preferably preliminarily heated before addition.

Examples of the method of preliminary heating the monomer solution include heating the monomer solution by means of a heat-exchanger or a similar element, in a reservoir or just before feeding to the polymerization system. The preliminary heating temperature is preferably 25° C. or higher, more preferably 30° C. or higher. However, in the case where the monomer solution is preliminarily heated in a reservoir, a heating state is maintained for a long period of time, and a high polymer is possibly formed. Thus, when the monomer solution is preliminarily heated in a reservoir, the preliminary heating temperature is preferably 50° C. or lower, more preferably 40° C. or lower. In some cases, the initiator solution may also be preliminarily heated. However, when the heating temperature is excessively high, the polymerization initiator is decomposed before supply to the solvent. Therefore, the heating temperature is generally 40° C. or lower, preferably 30° C. or lower, more preferably 25° C. or lower.

When the dropwise addition time of the monomer solution is short, molecular weight distribution is likely to broaden, and the temperature of a polymerization mixture is lowered due to dropwise addition of a large amount of a solution at one time, which is not preferred. In contrast, when the dropwise addition time is long, the polymer undergoes thermal history more than necessary, and productivity is reduced, which is not preferred. Therefore, the dropwise addition time is generally 0.5 to 24 hours, preferably 1 to 12 hours, particularly preferably 2 to 8 hours. No particular limitation is imposed on the order of addition of two liquids. In order to prevent generation of a high polymer, preferably, the two liquids are simultaneously added, or an initiator solution is added prior to addition of the monomer solution. Since a certain period of time is required for generating radicals via decomposition of the polymerization initiator, an initiator solution is particularly preferably added prior to addition of the monomer solution.

Preferably, aging is carried out after completion of dropwise addition by, for example, maintaining the polymerization mixture at the polymerization temperature at a predetermined period of time, or further elevating the temperature of the polymerization mixture to a higher level, so as to allow the remaining unreacted monomer to react. When the aging time is excessively long, productivity per unit time is reduced, and the polymer undergoes thermal history more than necessary, which is not preferred. Therefore, the aging time is generally 12 hours or shorter, preferably 6 hours or shorter, particularly preferably 1 to 4 hours.

During dropwise addition, the monomer concentration and the polymerization initiator concentration are preferably higher, from the viewpoint of productivity. Particularly when the polymerizable monomer or the polymerization initiator is in the liquid form, the monomer or initiator can be fed without dissolving in solvent. However, when the polymerizable monomer or the polymerization initiator is in the form of viscous liquid or solid, the monomer or initiator must be dissolved in solvent before addition. In the case where the monomer or initiator is dissolved in solvent, when the concentration is excessively high, the viscosity of the solution increases, impairing operability. When the polymerizable monomer or the polymerization initiator is solid, dispersion thereof in the polymerization system requires a long period of time, and a high polymer may be readily formed. Therefore, preferably, the monomer concentration or the initiator concentration is controlled so that the monomers and the polymerization initiator can be sufficiently dissolved in solvent, that no deposition occurs during addition, and that the components can readily disperse in the polymerization system, so long as feed operation is not impeded. Specific concentrations, which vary depending on, for example, the combination of the solute and solvent of the solution, are generally adjusted to, for example, a total monomer concentration and a polymerization initiator concentration of 5 to 60 mass %, respectively, preferably 10 to 50 mass %.

The polymerization temperature may be appropriately determined in consideration of, for example, the boiling points of the solvent, monomers, the chain-transfer agent, etc. and the half-life temperature of the polymerization initiator. When the polymerization temperature is low, polymerization is less likely to proceed, which causes problems in terms of productivity, whereas when the polymerization temperature is higher than necessary, problems arise in terms of stability of monomers and a polymer. Therefore, the polymerization temperature is preferably determined to fall within a range of 40 to 120° C., particularly preferably 60 to 100° C. When the polymerization temperature is adjusted to be equal to or higher than the initial boiling point of the solvent component at polymerization pressure, heat generated during polymerization reaction can be merged into the latent heat of vaporization of the solvent component, whereby the polymerization temperature is maintained at a constant level. Such a mode is particularly preferred, since the difference in polymerization temperature between production lots can be minimized, whereby the difference in Mw between production lots can be reduced.

The polymerization pressure may be appropriately predetermined. However, when the polymerization pressure varies, compression and expansion of the polymerization system, change in amount of solvent evaporation, etc. cause variation in the polymerization temperature, resulting in variation in Mw of the formed polymer. Therefore, the polymerization pressure needs to be maintained at a constant level. When a radical initiator is employed, nitrogen gas (in the case of azo-type initiator) or oxygen gas (in the case of peroxide-type initiator) is generated upon generation of radicals. If the generated gas is not removed from the system, the pressure of the system is problematically elevated during reaction. From the viewpoints of easy removal of the generated gas from the system and easy control of pressure, preferably, the polymerization system (excluding a liquid seal portion) is open to air, and the polymerization pressure is adjusted to near atmospheric pressure.

According to the present invention, the polymerization pressure can be regulated through the liquid level as mentioned hereinbelow, particularly under low atmospheric pressure, whereby variation in polymerization temperature can be mitigated, attaining uniformity of the polymer from lot to lot. The polymerization pressure is preferably predetermined to be equal to or higher than a mean annual atmospheric pressure of a place where the step (P) is carried out. For example, according to the data obtained by the Japan Meteorological Agency, the mean annual atmospheric pressure at Chiba-city, Chiba, from November 2005 to October 2006 was 1011 hPa with a maximum of 1030 hPa and a minimum of 987 hPa (mean+3σ: 1031 hPa, mean−3σ: 990 hPa). With respect to the mean atmospheric pressure, the maximum is higher by 1.9%, the minimum is lower by 2.3%, and 3σ is varied by 2.0%. When polymerization is performed in an open-to-air system equipped with no liquid seal portion (i.e., at atmospheric pressure), variation in polymerization pressure is equivalent to variation in atmospheric pressure. However, through adjusting the minimum polymerization pressure to mean atmospheric pressure by controlling the liquid level, variation in polymerization pressure can be suppressed to ½ or lower the variation that occurs without control.

(7) Liquid Seal Portion (W)

In the present invention, a liquid seal portion (W) is provided between a polymerization tank and the atmospheric air. Through controlling the difference in liquid level (hereinafter may be referred to as head difference) between the polymerization tank side (hereinafter may be referred to as a first side) and the atmospheric air side (hereinafter may be referred to as a second side), a pressure corresponding to the head difference is applied to the gas on the first side, whereby the polymerization pressure in the step (P) is regulated. The gas on the first side includes the vapor phase of the polymerization system, a gas dissolved in raw material, a gas generated through decomposition of a polymerization initiator, etc. The volume of the first-side gas increases by heating to the polymerization temperature. If necessary, a pressure-controlling gas (e.g., nitrogen or air) may be introduced to the first side. A pressure corresponding to the head difference may be applied to the first-side gas. When excess gas is present, the gas may be discharged to the atmospheric air (second side).

The liquid seal portion (W) must be disposed in any portion between the polymerization tank and the atmospheric air. Specifically, the liquid seal portion (W) may be disposed in one or more portions selected from among a vapor line (V1) for transferring vapor generated in the polymerization tank to a condenser; a condenser (V2) for cooling vapor to form liquid; a gas-liquid separation tank (V3) for separating condensed liquid and gas; a reflux line (V4) for returning condensed liquid to the polymerization tank; and a gas-discharge line (V5) for transferring to atmospheric air a gas separated from liquid. Preferably, the liquid seal portion (W) is disposed in one or more portions selected from among the condenser (V2), the gas-liquid separation tank (V3), and the gas-discharge line (V5), particularly preferably in the gas-discharge line (V5). Notably, the condenser (V2) may serve as the gas-liquid separation tank (V3), or the vapor line (V1) may serve as the reflux line (V4).

In the case where the liquid seal portion (W) is disposed in any of the vapor line (V1), the condenser (V2), the gas-liquid separation tank (V3), and the reflux line (V4), the sealing liquid is preferably a polymerization solvent which has been vaporized in the polymerization tank, followed by condensing. When the liquid seal portion (W) is disposed in the gas-discharge line (V5), liquids such as water, organic solvent, liquid paraffin, and silicone oil may be employed. From the viewpoint of safety, use of water is particularly preferred.

The liquid seal portion (W) may be provided in a container which has a gas inlet (W1) and a gas outlet (W2) and in which the gas inlet (W1) can be disposed below the sealing liquid level (hereinafter may be referred to as a liquid-sealable container (W0)). The liquid-sealable container (W0) may further include a sealing liquid inlet (W3), which is provided separately or serves as the gas inlet (W1), and yet further include a sealing liquid outlet (W4). Furthermore, the liquid-sealable container (W0) may also serve as the condenser (V2) or the gas-liquid separation tank (V3).

The head difference may be generated through introduction of a first-side gas into the liquid seal portion (W0) formed by feeding a sealing liquid to the liquid-sealable container (W0). The head difference is regulated through modifying the height of the sealing liquid inlet (W1) and/or the amount of sealing liquid. From the viewpoint of structural simplicity and easy control, modifying the amount of sealing liquid is preferably selected. The amount of sealing liquid may be adjusted by introducing sealing liquid through the sealing liquid inlet (W3) and/or discharging sealing liquid through the sealing liquid outlet (W4).

When the atmospheric pressure is lower than the target polymerization pressure and pressurization is needed, the liquid seal portion (W) compensates the head difference. The head difference to be compensated can be determined by the following equation.

$$H_L = (P_P - P_A) \times 10 / G_L \quad \text{Equation (1)}$$

(wherein $H_L$ represents a head difference (mm), $P_P$ represents a target polymerization pressure (hPa), $P_A$ represents atmospheric pressure (hPa), and $G_L$ represents a specific weight of sealing liquid (g/mL)). For example, when the target polymerization pressure is 1013 hPa, the atmospheric pressure is 1000 hPa, and the specific weight of the sealing liquid (water) is 1 g/mL, the sealing liquid level is 130 mm. Notably, when the atmospheric pressure is higher than the target polymerization pressure, the head difference is preferably controlled to 0 by removing liquid sealing through, for example, elevating the position of the gas inlet or reducing the amount of sealing liquid.

In a particularly preferred mode of regulating the head difference, the liquid-sealable container (W0) is provided with a liquid level meter for measuring the head difference. Through synchronizing with pressure measurements obtained by means of an atmospheric pressure sensor, a sealing liquid introduction valve or a sealing liquid introduction pump and a sealing liquid charge valve are operated, to thereby realize automatic control.

2. Step (Q)

Step (Q) is performed at the same timing with or after step (P). In step (Q), a polar group of the polymer is converted to another polar group through protecting or deprotecting a polar group of the polymer. Specific examples of the procedure of step (Q) include a step (Q1) in which polar groups (A) or (B) of the polymer are partially or totally protected with an acid-dissociable dissolution-inhibitive group, to thereby introduce polar groups (C); and a step (Q2) in which polar groups (C) of the polymer are partially or totally deprotected, to thereby introduce polar groups (A) or (B).

In step (Q1), a polymer having an alkali-soluble group is dissolved in a solvent, and the polymer is reacted with an enol ether, a halogenated alkyl ether, or the like in the presence of a catalyst, to thereby introduce an acid-dissociable dissolution-inhibitive group. In step (Q2), a polymer having an acid-dissociable dissolution-inhibitive group is dissolved in a solvent, and the polymer is heated in the presence of a catalyst, to thereby dissociate the acid-dissociable dissolution-inhibitive group and introduce an alkali-soluble group.

No particular limitation is imposed on the catalyst employed in steps (Q1) and (Q2), so long as the catalyst attains the aforementioned reactions. The catalyst is preferably a strong acid exhibiting a pKa of 1 or less at 25° C. in water, and specific examples include hydrochloric acid, sulfuric acid, p-toluenesulfonic acid, trifluoroacetic acid, and strong acidic ion exchange resin. Examples of preferred solvent may be the same as those described above as solvents in step (P). However, in step (Q1), use of a solvent having a hydroxyl group (e.g., water or alcohol) is avoided to a maximum possible extent, since such a solvent reacts with enol ether or halogenated alkyl ether.

3. Step (R)

In the step (R), extraction with a solvent is carried out for removal of unreacted substances (e.g., monomers or a polymerization initiator) or low-molecular-weight components (e.g., oligomers) contained in the polymer produced through the step (P). The step (R) may be, for example, (R1): a process in which the polymer is precipitated through addition of a poor solvent, and then separation of the solvent phase is performed; (R1a): a process in which, after completion of the step (R1), a poor solvent is added to wash the polymer, and then separation of the solvent phase is performed; (R1b): a process in which, after completion of the step (R1), a good solvent is added to redissolve the polymer, and a poor solvent is added to reprecipitate the polymer, followed by separation of the solvent phase; (R2): a process in which a poor solvent is added to form two solvent phases (i.e., poor solvent phase and good solvent phase), and separation of the poor solvent phase is performed; or (R2a): a process in which, after completion of the step (R2), a poor solvent is added to wash the good solvent phase, and then separation of the poor solvent phase is performed. The step (R1a), (R1b), or (R2a) may be repeatedly carried out, or these steps may be carried out in combination.

No particular limitation is imposed on the poor solvent, so long as the polymer is less likely to dissolve therein. Examples of the poor solvent include water, alcohols such as methanol and isopropanol, and saturated hydrocarbons such as hexane and heptane. No particular limitation is imposed on the good solvent, so long as the polymer is likely to dissolve therein. Examples of the good solvent may be the same as those described above as polymerization solvents. A single good solvent or a mixture of two or more good solvents may be employed. The good solvent is preferably the same as a polymerization solvent, from the viewpoint of control of the production process.

4. Step (S)

In step (S), low-boiling-point impurities are removed from a polymer solution, or the original solvent is exchanged with a solvent suitable for a subsequent step or the composition for lithography. The step (S) may be, for example, a step (S1) in which a polymer solution is concentrated with heating under reduced pressure, and optionally, a solvent is added to the solution, followed by further concentration; or a step (S2) in which a polymer solution is optionally concentrated with heating under reduced pressure, subsequently, a solvent suitable for a subsequent step or the composition for lithography is supplied while the original solvent and the thus-supplied solvent are removed through evaporation, and optionally, further concentration is performed so as to replace the original solvent with the solvent suitable for the subsequent step or the composition for lithography.

The step (S) is carried out in the case where, for example, the solvent of the composition for lithography differs from the solvent of the polymer solution obtained through the steps (P) and (R), or undesirable impurities are contained in the composition for lithography. Preferably, the step (S) is carried out before the step (U) of preparing the composition for lithography.

The polymer solution may be temporarily formed into a solid through drying under reduced pressure without being subjected to the step (S), followed by dissolution of the solid in another solvent. However, this procedure is not preferred, since impurities or the solvent is likely to remain in the solid, or the polymer undergoes thermal history more than necessary.

No particular limitation is imposed on the temperature of the step (S), so long as the polymer is not degraded. Generally, the temperature is preferably 100° C. or lower, more preferably 80° C. or lower, much more preferably 70° C. or lower, particularly preferably 60° C. or lower. When the amount of a solvent newly supplied for solvent replacement is excessively small, low-boiling-point compounds cannot be sufficiently removed, whereas when the amount of the solvent is excessively large, a long period of time is required for solvent replacement, and the polymer undergoes thermal history more than necessary, which is not preferred. The amount of the solvent is generally 1.05 to 10 times (preferably 1.1 to 5 times, particularly preferably 1.2 to 3 times) that of the solvent required for a finished solution.

5. Step (T)

In step (T), metal components undesirable for semiconductor lithography are reduced in amount. The step (T) is optionally carried out, since metal components may enter the polymer solution from raw materials, sub-materials, apparatuses, or the environment, and the amount of the metal components may exceed an acceptable level for semiconductor formation. When the poor solvent employed in the step (R) is a polar solvent, the amount of metal components may be reduced in the step (R). In such a case, the step (R) may also serve as the step (T). Alternatively, the step (T) may be, for example, a step (T1) in which the polymer solution is brought into contact with a cation exchange resin; a step (T2) in which the polymer solution is brought into contact with a cation exchange resin, and an anion exchange resin or a mixture of acid-adsorbing resins; or a step (T3) in which the polymer solution is caused to pass through a filter containing a substance having a positive zeta potential (e.g., polyamide-polyamine-epichlorohydrin cationic resin). These steps may be carried out in combination. Examples of the filter employed in the step (T3) include products of Cuno Inc., such as Zeta Plus 40QSH, Zeta Plus 020GN, and Electropor IIEF.

6. Step (U)

In step (U), undesirable microgels of high polymer or the like, which may cause pattern defects, are reduced in amount by causing the polymer dissolved in an organic solvent to pass through a filter. The filtration accuracy of the filter employed is 0.2 μm or less, preferably 0.1 μm or less, particularly preferably 0.05 μm or less. Examples of the material of the filter include polyolefins such as polyethylene and polypropylene; polar-group-containing resins such as polyamide, polyester, and polyacrylonitrile; and fluorine-containing resins such as polyethylene fluoride. Among them, polyamide is particularly preferred. Examples of the polyamide filter include Ultipleat P-Nylon 66 and Ultipor N66 (products of Pall Corporation) and PhotoSHIELD and Electropor IIEF (products of Cuno Inc.). Examples of the polyethylene filter include Microguard Plus HC10 and Optimizer D (products of Nihon Entegris K.K.). These filters may be employed singly or in combination of two or more species.

7. Lithography composition

The polymer produced through the aforementioned method may be prepared into a composition for lithography through the following procedure: a dried solid of the polymer is dissolved in one or more solvents for lithography, or a solution of the polymer in a solvent for lithography is optionally diluted with the same or a different solvent for lithography; and the thus-prepared solution or diluted solution is mixed with required additives.

No particular limitation is imposed on the solvent for lithography, so long as it can dissolve components of the composition for lithography to give a uniform solution. The solvent for lithography employed may be any one of known solvents for lithography, or a mixture of two or more species of the solvents. Generally, the solvent for lithography may be selected from among the above-exemplified reaction solvents in the step (P) and the above-exemplified good solvents in the step (R), in consideration of, for example, solubility of components other than the polymer, viscosity, boiling point, and absorption of radiation employed for lithography. Specific examples of preferred solvents for lithography include methyl amyl ketone, cyclohexanone, ethyl lactate (EL), γ-butyrolactone, and PGMEA. Of these, PGMEA is preferred, and a mixture of PGMEA and another polar solvent is particularly preferred. No particular limitation is imposed on the amount of the resist solvent contained in the resist composition. However, generally, the amount of the solvent is appropriately determined so that the polymer concentration of the composition is such a level that it can be applied to, for example, a substrate, and so that the composition has an appropriate viscosity corresponding to application thickness. The amount of the solvent employed is determined so that the solid content of the resist composition is generally 2 to 20 mass %, preferably 5 to 15 mass %.

Taking a chemical amplification-type resist composition as an example, additives for preparing the composition for lithography will next be described. For preparing a chemical amplification-type resist composition, a radiation-sensitive acid-generator (X) (hereinafter may be referred to as a "component (X)"), an acid diffusion preventing agent (Y) (e.g., a nitrogen-containing organic compound) for preventing diffusion of an acid to a portion which is not irradiated (hereinafter may be referred to as a "component (Y)"), and an additional additive (Z) (hereinafter may be referred to as a "component (Z)") may be incorporated into the composition.

The component (X) may be appropriately selected from among radiation-sensitive acid-generators which have been proposed for chemical amplification-type resists. Examples of such a radiation-sensitive acid-generator include onium salts such as iodonium salts and sulfonium salts; oxime sulfonates; diazomethanes such as bisalkyl or bisarylsulfonyldiazomethanes; nitrobenzyl sulfonates; iminosulfonates; and disulfones. Particularly preferred is an onium salt in which a fluorinated alkyl sulfonate ion serves as an anion. These agents may be employed singly or in combination of two or more species. The component (X) is generally incorporated in an amount of 0.5 to 30 parts by mass, preferably 1 to 10 parts by mass, on the basis of 100 parts by mass of the polymer.

The component (Y) may be appropriately selected from among acid diffusion preventing agents which have been proposed for chemical amplification-type resists. Such an acid diffusion preventing agent may be a nitrogen-containing organic compound and is preferably a primary to tertiary alkylamine or a hydroxyalkylamine. Particularly preferred is a tertiary alkylamine or a tertiary hydroxyalkylamine; in particular, triethanolamine or triisopropanolamine. These agents may be employed singly or in combination of two or more species. The component (Y) is generally incorporated in an amount of 0.01 to 5.0 parts by mass on the basis of 100 parts by weight of the polymer.

If necessary, the additional additive (component (Z)) may be appropriately added. Examples of the additive include compounds which have conventionally been used as additives for resists, such as organic carboxylic acids and phosphorus oxo acids for preventing reduction in sensitivity of an acid-generator or for improving, for example, the form of lithography patterns or post-exposure stability, additional resins for improving the performance of a resist film, surfactants for improving applicability of the composition, dissolution-inhibiting agents, plasticizers, stabilizers, coloring agents, antihalation agents, and dyes. Examples of the organic carboxylic acid include malonic acid, citric acid, malic acid, succinic acid, benzoic acid, and salicylic acid. These acids may be employed singly or in combination of two or more species. Such an organic carboxylic acid is incorporated in an amount of 0.01 to 5.0 parts by mass on the basis of 100 parts by mass of the polymer.

EXAMPLES

The present invention will next be described in more detail by way of examples, which should not be construed as limiting the invention thereto. In the following Examples, abbreviations have the following meanings.
Monomers
monomer O: 3-Hydroxy-1-adamantyl methacrylate . . . the aforementioned (A203)
monomer M: 2-Methyl-2-adamantyl methacrylate . . . the aforementioned (B3107)
monomer N: 5-Methacryloyloxy-2,6-norbornanecarbolactone . . . the aforementioned (C151)
Repeating Units
O: Repeating unit derived from monomer O
M: Repeating unit derived from monomer M
N: Repeating unit derived from monomer N
Polymerization Initiator
MAIB: Dimethyl-2,2'-azobisisobutyrate
Solvents
MEK: Methyl ethyl ketone
THF: Tetrahydrofuran
PGMEA: Propylene glycol monomethyl ether acetate
EL: Ethyl lactate
(1) Measurement of Mw and Mw/Mn of Polymer (GPC)
The Mw and Mw/Mn of a polymer were measured through GPC under the following analysis conditions.
Apparatus: GPC 8220 (product of Tosoh Corporation)
Detector: Differential refractive index (RI) detector
Column: KF-804L (×3) (product of Showa Denko K.K.)
Sample: A polymer (about 0.02 g) was dissolved in tetrahydrofuran (about 1 mL). The amount of the sample applied to GPC was adjusted to 60 µL.

(2) Measurement of Repeating Unit Composition and End Composition of Polymer ($^{13}$C-NMR)
Apparatus: AV 400 (product of Bruker)
Sample: Powder of a polymer (about 1 g) and Cr(acac)$_2$ (0.1 g) were dissolved in MEK (0.5 g) and deuterated acetone (1.5 g)
Measurement: The sample was placed into a glass tube (inner diameter: 10 mm), and measurement was carried out at 40° C. (number of scans: 10,000).

Example 1

A polymerization tank (capacity: 200 L) having a glass lining was installed at Goiminami-kaigan (Ichihara-city, Chiba). The polymerization tank was equipped with a jacket for feeding a heat medium, an agitator, a monomer-feed tank, an initiator-feed tank, a vapor line (V1), a condenser (V2), a gas-liquid separation tank (V3), a reflux line (V4), a gas-discharge line (V5). The gas-discharge line (V5) was equipped with a nitrogen gas (for controlling pressure) introduction tube and a liquid-sealable container (W0). The liquid-sealable container (W0) was equipped with a gas inlet (W1), a gas outlet (W2), a sealing liquid inlet (W3), a sealing liquid outlet (W4), an atmospheric pressure sensor, a liquid level meter, a sealing liquid introduction pump, and a sealing liquid discharge valve. The sealing liquid introduction pump and the sealing liquid discharge valve were operated in response to the signals fed by the atmospheric sensor and the liquid level meter, whereby a required amount of sealing liquid was taken from a sealing liquid reservoir tank, and an excessive amount of the liquid was returned to the sealing liquid reservoir tank. Through this mechanism, the head difference to be compensated was ensured. Water was employed as a sealing liquid.

The polymerization tank was purged with nitrogen. Under nitrogen atmosphere, MEK (30.0 kg) was fed to the tank, and a small amount of nitrogen was introduced thereto through the nitrogen introduction tube, to thereby intercept entering of air. The sealing liquid was fed to a liquid seal apparatus, and the liquid level was adjusted by means of the aforementioned system, whereby the pressure inside the polymerization tank was maintained at 1013 hPa or higher.

To a monomer-feed tank (capacity: 200 L) having a glass lining and equipped with a jacket and an agitator, MEK (70.0 kg), monomer N (17.7 kg), monomer M (18.8 kg), and monomer O kg) were fed. In a nitrogen atmosphere, the contents of the tank were dissolved under stirring, with hot water (30±2° C.) being caused to flow through the jacket, to thereby prepare a uniform "monomer solution." Separately, MEK (5.0 kg) and MAIB (2.5 kg) were fed to an initiator-feed tank (made of polyethylene, capacity of 20 L) equipped with an agitator, and the contents were stirred for dissolution, with the tank being immersed in a hot water tank maintained at 30±2° C., whereby a uniform "initiator solution" was prepared. MEK placed in the polymerization tank was heated to 79.5° C. under stirring, with hot water maintained at 83.0±0.5° C. being caused to flow through the jacket of the polymerization tank. The pressure condition (≧1,013 hPa) was maintained. Through continuously causing hot water (30±1° C.) to flow through the jacket of the monomer-dissolution tank, the temperature of the monomer solution was maintained at 30±1° C. until completion of the dropwise addition of the monomer solution. The initiator-dissolution tank was removed from the hot water tank, set in measuring apparatus, and maintained at about 23° C. (room temperature) until completion of dropwise addition. While the conditions were maintained, the monomer solution and the initiator solution were separately added dropwise at a constant rate to the polymerization tank over 4 hours. During addition, the contents of the polymerization tank were stirred, and hot water (controlled at 83.0±0.5° C.) was continuously caused to flow through the jacket. After completion of addition, the contents of the polymerization tank were stirred, and hot water (controlled at 83.0±0.5° C.) was continuously caused to flow through the jacket, whereby the contents were aged for two hours. The polymerization pressure was maintained at 1,013 hPa or higher until the end of aging by means of a liquid-seal-based pressure-controlling system. After completion of aging, cooling water (about 20° C.) was caused to flow through the jacket, to thereby cool the contents to room temperature.

To a refining and filtration tank equipped with a jacket, an agitator, a filtration bed with a polyester filter cloth, and a discharge pipe with a valve disposed at the bottom of the filtration bed, methanol (15° C., 750 kg) were fed. The contents were stirred, with brine (15±1° C.) being caused to flow through the jacket, and the stirring state was maintained. The above-produced polymer liquid was added dropwise to methanol, to thereby precipitate a polymer, and stirring was continued for 30 minutes. Subsequently, under continuous stirring, the liquid discharge valve disposed at the bottom of the filtration bed was opened, to thereby discharge the filtrate and recover a wet cake. Then, the liquid discharge valve disposed at the bottom of the filtration bed was closed, and methanol (15° C., 750 kg) was fed to the refining and filtration tank. The contents were maintained at 15° C. and stirred for 30 minutes. Under continuous stirring, the liquid discharge valve disposed at the bottom of the filtration bed was opened, to thereby discharge the filtrate and recover a wet cake. This operation was repeated. A portion (some grams) of the resulted wet cake was removed, and dried at 60° C. or lower for one hour under reduced pressure, to thereby yield a dry powder. The repeating unit composition was determined through $^{13}$C-NMR.

Subsequently, the liquid discharge valve disposed at the bottom of the filtration bed was closed, and the remaining portion of the wet cake was dissolved with MEK (200 kg) fed thereto. Then, the solution was removed from the refining and filtration tank by opening the liquid discharge valve. The thus-removed solution was fed to a solvent-replace tank equipped with a jacket, an agitator, and a condenser. The solution was evacuated under stirring, and heated with hot water (55±1° C.) being caused to flow through the jacket. A portion of light fractions (e.g. MEK) was distilled off. Through evaporating the remaining portion of the light fractions and a portion of PGMEA while PGMEA was continuously added thereto, a PGMEA solution containing 25 mass % of the polymer was yielded. Through GPC analysis of the obtained PGMEA solution, the polymer was found to have a Mw of 8,120 and a Mw/Mn of 1.63.

In a similar manner, 10 batches of the polymer in total were produced. Polymerization conditions and properties of the products are shown in Table 1. Notably, in order to avoid a day-to-day error of GPC measurement, when the Mw of each batch of the polymer was determined, the Mw of the first batch was additionally determined. On the basis of the difference between the Mw of the first batch and the Mw of each batch, variation in Mw was evaluated.

Comparative Example

The procedure of Example 1 was repeated, except that polymerization was performed at a pressure equal to atmospheric pressure, without controlling polymerization pressure by means of the pressure-controlling system having a liquid seal portion (W). Ten batches in total were produced, and polymerization conditions and properties of the products are shown in Table 2. Notably, in order to avoid a day-to-day error of GPC measurement, when the Mw of each batch of the polymer was determined, the Mw of the first batch of Example 1 was additionally determined. On the basis of the difference between the Mw of the first batch of Example 1 and the Mw of each batch, variation in Mw was evaluated.

TABLE 1

| | Example | | | | | | | | | | |
|---|---|---|---|---|---|---|---|---|---|---|---|
| | Polymerization temp. (° C.) | | | Polymerization pressure (hPa) | | | GPC | | Composition by NMR (mol %) | | |
| Lot | Start of addition | End of aging | Av. (/h) | Start of addition | End of aging | Av. (/h) | Mw Δref | Mw/Mn Δref | N | M | O |
| 1 | 79.3 | 79.7 | 79.9 | 1,013 | 1,013 | 1,013 | 0 | 0.00 | 42.4 | 38.6 | 19.0 |
| 2 | 79.4 | 79.8 | 79.9 | 1,017 | 1,017 | 1,017 | −30 | 0.02 | 42.3 | 38.9 | 18.8 |
| 3 | 79.6 | 80.0 | 80.1 | 1,025 | 1,025 | 1,025 | −100 | 0.02 | 42.7 | 39.0 | 18.3 |
| 4 | 79.7 | 80.1 | 80.1 | 1,029 | 1,029 | 1,029 | −150 | −0.01 | 42.9 | 38.7 | 18.4 |
| 5 | 79.5 | 79.9 | 80.0 | 1,021 | 1,021 | 1,021 | −10 | 0.01 | 42.5 | 38.7 | 18.8 |
| 6 | 79.3 | 79.8 | 79.8 | 1,013 | 1,017 | 1,015 | 40 | 0.00 | 42.3 | 38.9 | 18.8 |
| 7 | 79.3 | 79.7 | 79.8 | 1,013 | 1,013 | 1,013 | 0 | 0.00 | 42.6 | 38.8 | 18.6 |
| 8 | 79.3 | 79.8 | 79.9 | 1,013 | 1,017 | 1,015 | −50 | 0.01 | 42.2 | 38.9 | 18.9 |
| 9 | 79.3 | 79.7 | 79.9 | 1,013 | 1,013 | 1,013 | 70 | 0.01 | 42.8 | 38.5 | 18.7 |
| 10 | 79.4 | 79.8 | 79.9 | 1,017 | 1,017 | 1,017 | 30 | 0.01 | 42.5 | 38.6 | 18.9 |
| Mean | 79.4 | 79.8 | 79.9 | 1,018 | 1,018 | 1,018 | −20 | 0.01 | 42.5 | 38.8 | 18.7 |
| SD | 0.14 | 0.13 | 0.09 | 6 | 5 | 5 | 70 | 0.01 | 0.23 | 0.16 | 0.23 |

TABLE 2

| | Polymerization temp. (° C.) | | | Polymerization pressure (hPa) | | | GPC | | Composition by NMR (mol %) | | |
|---|---|---|---|---|---|---|---|---|---|---|---|
| | Start of | End of | Av. | Start of | End of | Av. | Mw | Mw/Mn | | | |
| Lot | addition | aging | (/h) | addition | aging | (/h) | Δref | Δref | N | M | O |
| 1 | 79.6 | 80.1 | 80.0 | 1,025 | 1,029 | 1,027 | 20 | −0.00 | 42.3 | 38.8 | 18.9 |
| 2 | 79.9 | 80.1 | 80.1 | 1,036 | 1,029 | 1,033 | −160 | 0.01 | 43.0 | 38.5 | 18.5 |
| 3 | 79.7 | 80.0 | 80.0 | 1,028 | 1,025 | 1,027 | −10 | 0.03 | 42.7 | 39.0 | 18.3 |
| 4 | 79.1 | 79.5 | 79.8 | 1,005 | 1,006 | 1,006 | 130 | 0.02 | 42.3 | 38.7 | 19.0 |
| 5 | 79.1 | 79.4 | 79.7 | 1,005 | 1,002 | 1,004 | 70 | 0.03 | 42.4 | 38.5 | 19.1 |
| 6 | 79.4 | 79.7 | 79.8 | 1,017 | 1,013 | 1,015 | −10 | 0.00 | 42.7 | 38.5 | 18.8 |
| 7 | 79.1 | 79.3 | 79.6 | 1,005 | 998 | 1,002 | 230 | 0.02 | 42.5 | 38.7 | 18.8 |
| 8 | 78.8 | 79.3 | 79.5 | 994 | 998 | 996 | 280 | 0.03 | 42.6 | 38.8 | 18.6 |
| 9 | 79.1 | 79.6 | 79.8 | 1,005 | 1,010 | 1,007 | 50 | −0.00 | 42.4 | 38.7 | 18.9 |
| 10 | 79.2 | 79.6 | 79.8 | 1,009 | 1,010 | 1,009 | 70 | 0.03 | 42.6 | 38.6 | 18.8 |
| Mean | 79.3 | 79.8 | 79.8 | 1,013 | 1,012 | 1,012 | 70 | 0.02 | 42.6 | 38.7 | 18.8 |
| SD | 0.34 | 0.31 | 0.20 | 13 | 12 | 12 | 130 | 0.01 | 0.22 | 0.16 | 0.24 |

The invention claimed is:

1. A method for producing a polymer for semiconductor lithography comprising the step (P) of heating a polymerizable monomer and a polymerization initiator in a solvent in a polymerization tank, to thereby polymerize the monomer, the step (P) including the step of controlling a polymerization pressure by regulating a liquid level in a container (WO) which is disposed between the polymerization tank and the atmospheric air and which provides liquid sealing.

2. The method for producing the polymer for semiconductor lithography according to claim 1, wherein, in the step (P), a liquid seal portion (W) is formed in the container (WO) which is disposed between the polymerization tank and the atmospheric air and which provides liquid sealing; and a pressure corresponding to the difference in a liquid level in the liquid seal portion (W) between a polymerization tank side and an atmospheric air side thereof is applied to the polymerization tank side.

3. The method for producing the polymer for semiconductor lithography according to claim 1 or 2, wherein a gas for controlling pressure is introduced to the liquid seal portion (W) from the polymerization tank side.

4. The method for producing the polymer for semiconductor lithography according to any of claims 1 to 3, wherein the step (P) further comprises the step of dropwise adding the polymerizable monomer and the polymerization initiator in the heated solvent.

5. The method for producing the polymer for semiconductor lithography according to any of claims 1 to 4, wherein a polymerization temperature employed in the step (P) is adjusted to a temperature equal to or higher than an initial boiling point of a component contained as a polymerization solvent.

6. The method for producing the polymer for semiconductor lithography according to any of claims 1 to 5, wherein the polymerization pressure employed in the step (P) is adjusted to be equal to or higher than a mean annual atmospheric pressure of a place where the step (P) is carried out.

7. The method for producing the polymer for semiconductor lithography according to any of claims 1 to 6, wherein the polymerizable monomer comprises at least one member selected from among a monomer (A) having a hydroxyl group, a monomer (B) having a structure in which a hydroxyl group is protected by a group which inhibits dissolution in an alkaline developer and which dissociates by the action of an acid, a monomer (C) having a lactone structure, and a monomer (D) having a cyclic ether structure.

8. The method for producing the polymer for semiconductor lithography according to claim 7, wherein the monomer (A) comprises at least one structure selected from among formula (A1):

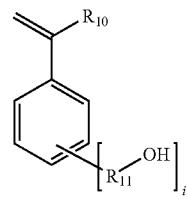

(A1)

(wherein $R_{10}$ represents a hydrogen atom or a C1-C4 hydrocarbon group which may be substituted by a fluorine atom; $R_{11}$ represents a single bond or a C1-C4 divalent hydrocarbon group which may be substituted by a fluorine atom; and i is an integer of 1 or 2), formula (A2):

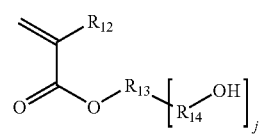

(A2)

(wherein $R_{12}$ represents a hydrogen atom or a C1-C4 hydrocarbon group which may be substituted by a fluorine atom; $R_{13}$ represents a C2-C12 2- to 4-valent hydrocarbon group which may include a fluorine atom, an oxygen atom, or a sulfur atom; $R_{14}$ represents a single bond or a C1-C4 divalent hydrocarbon group which may be substituted by a fluorine atom;

and j is an integer of 1 to 3), and formula (A3):

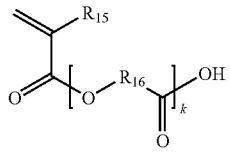
(A3)

(wherein $R_{15}$ represents a hydrogen atom or a C1-C4 hydrocarbon group which may be substituted by a fluorine atom; $R_{16}$ represents a C6-C12 divalent alicyclic hydrocarbon group which may include an oxygen atom or a sulfur atom; and k is an integer of 0 or 1).

9. The method for producing the polymer for semiconductor lithography according to claim 7 or 8, wherein the monomer (B) comprises a structure in which a hydroxyl group of the monomer (A) is protected by at least one group which inhibits dissolution in the alkaline developer and which dissociates by the action of the acid, the group being selected from among formula (b1):

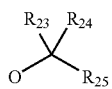
(b1)

(wherein o represents a binding site of formula (b1), each of $R_{23}$ and $R_{24}$ independently represents a C1-C4 hydrocarbon group, and $R_{25}$ represents a C1-C12 hydrocarbon group or may be linked to $R_{23}$ or $R_{24}$ to form a ring) and formula (b2):

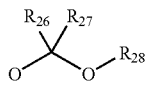
(b2)

(wherein o represents a binding site of formula (b2), each of $R_{26}$ and $R_{27}$ independently represents a hydrogen atom or a C1-C4 hydrocarbon group, $R_{28}$ represents a C1-C12 hydrocarbon group, and $R_{26}$ may be linked to $R_{27}$ or $R_{28}$ to form a ring).

10. The method for producing the polymer for semiconductor lithography according to any of claim 7 or 9, wherein the monomer (C) comprises a structure represented by formula (C1):

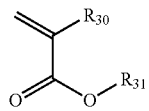
(C1)

[wherein $R_{30}$ represents a hydrogen atom or a C1-C4 hydrocarbon group which may be substituted by a fluorine atom; $R_{31}$ represents a lactone-structure-including group represented by formula (c):

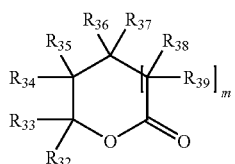
(c)

(wherein any one of $R_{32}$ to $R_{39}$ represents a single bond having a binding site of $R_{31}$, and the remaining ones of $R_{32}$ to $R_{39}$ each represent a hydrogen atom or a C1-C4 hydrocarbon or alkoxy group; or
any one of $R_{32}$ to $R_{39}$ represents a C3-C12 hydrocarbon group which may include an oxygen atom or a sulfur atom, said hydrocarbon group having a binding site of $R_{31}$ and being bonded to any one or two of the remaining ones of $R_{32}$ to $R_{39}$ to form a C5-C15 alicyclic ring, any one or two of the remaining ones of $R_{32}$ to $R_{39}$ represent a single bond for forming the aforementioned C5-C15 alicyclic ring, and the further remaining ones of $R_{32}$ to $R_{39}$ each represent a hydrogen atom or a C1-C4 hydrocarbon or alkoxy group, and m is an integer of 0 or 1).

11. The method for producing the polymer for semiconductor lithography according to any of claims 7 to 10, wherein the monomer (D) comprises a structure represented by formula (D1):

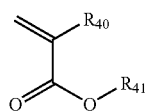
(D1)

(wherein $R_{40}$ represents a hydrogen atom or a C1-C4 hydrocarbon group which may be substituted by a fluorine atom, and $R_{41}$ represents a C3-C7 hydrocarbon group having a 3- to 6-membered cyclic ether structure).

* * * * *